(12) United States Patent
Ogura et al.

(10) Patent No.: US 10,570,287 B2
(45) Date of Patent: Feb. 25, 2020

(54) NON-AQUEOUS DISPERSANT, COLOR MATERIAL DISPERSION LIQUID FOR COLOR FILTER, COLOR FILTER, LIQUID CRYSTAL DISPLAY DEVICE AND ORGANIC LIGHT-EMITTING DISPLAY DEVICE

(71) Applicant: DAI NIPPON PRINTING CO., LTD., Tokyo-to (JP)

(72) Inventors: Michihiro Ogura, Tokyo-to (JP); Tomoki Murata, Tokyo-to (JP); Fumiyasu Murakami, Tokyo-to (JP); Masato Okada, Tokyo-to (JP); Hiroaki Segawa, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 715 days.

(21) Appl. No.: 15/101,360

(22) PCT Filed: Oct. 2, 2014

(86) PCT No.: PCT/JP2014/076462
§ 371 (c)(1),
(2) Date: Sep. 12, 2016

(87) PCT Pub. No.: WO2015/083426
PCT Pub. Date: Jun. 11, 2015

(65) Prior Publication Data
US 2016/0376443 A1 Dec. 29, 2016

(30) Foreign Application Priority Data
Dec. 5, 2013 (JP) .................................. 2013-251876

(51) Int. Cl.
| | |
|---|---|
| C08F 265/06 | (2006.01) |
| C08F 8/40 | (2006.01) |
| C09B 11/24 | (2006.01) |
| C09B 63/00 | (2006.01) |
| C09B 67/46 | (2006.01) |
| G02B 5/22 | (2006.01) |
| G02F 1/1335 | (2006.01) |
| H01L 51/00 | (2006.01) |

(Continued)

(52) U.S. Cl.
CPC .............. *C09B 67/009* (2013.01); *C08F 8/40* (2013.01); *C08F 265/06* (2013.01);
(Continued)

(58) Field of Classification Search
CPC ....... C09B 67/009; C09B 11/12; C09B 11/24; C09B 63/005; C08F 8/40; C08F 265/06;
(Continued)

(56) References Cited

U.S. PATENT DOCUMENTS

| 5,114,822 A | 5/1992 | Kato et al. |
|---|---|---|
| 2014/0037866 A1 | 2/2014 | Okada |

(Continued)

FOREIGN PATENT DOCUMENTS

| JP | 4-045456 | 2/1992 |
|---|---|---|
| JP | 2000-104005 | 4/2000 |

(Continued)

*Primary Examiner* — Irina S Zemel
*Assistant Examiner* — Jeffrey S Lenihan
(74) *Attorney, Agent, or Firm* — Hamre, Schumann, Mueller & Larson, P.C.

(57) ABSTRACT

Disclosed is a non-aqueous dispersant which is a graft copolymer comprising a constitutional unit represented by the following general formula (II) and at least one kind selected from the group consisting of a constitutional unit represented by the following general formula (I) and a constitutional unit represented by the following general formula (I'), or which is a block copolymer comprising a block portion containing a constitutional unit represented by the following general formula (III) and a block portion containing at least one kind selected from the group consisting of a constitutional unit represented by the following general formula (I) and a constitutional unit represented by the following general formula (I'):

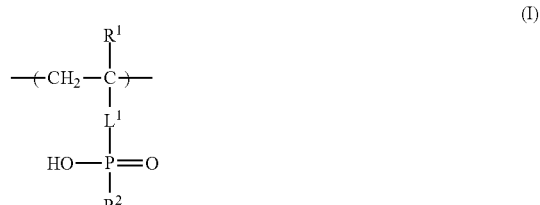

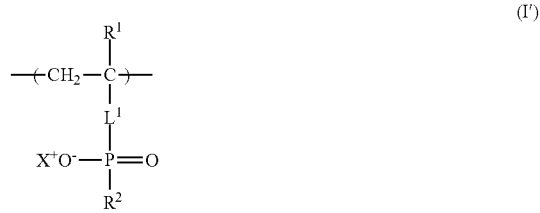

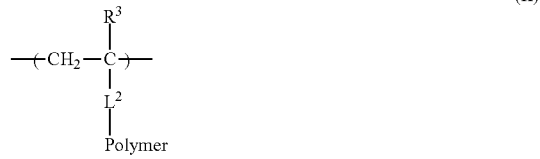

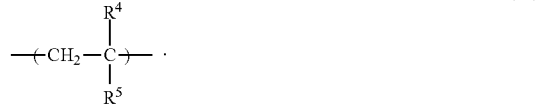

9 Claims, 1 Drawing Sheet

(51) Int. Cl.
*C08F 290/02* (2006.01)
*C09B 11/12* (2006.01)
*G02B 5/20* (2006.01)
*C08F 297/02* (2006.01)
*C08L 53/00* (2006.01)
*C08K 5/00* (2006.01)
*H01L 27/32* (2006.01)

(52) U.S. Cl.
CPC .......... *C08F 290/02* (2013.01); *C08F 297/02* (2013.01); *C08L 53/00* (2013.01); *C09B 11/12* (2013.01); *C09B 11/24* (2013.01); *C09B 63/005* (2013.01); *G02B 5/201* (2013.01); *G02B 5/223* (2013.01); *G02F 1/133514* (2013.01); *H01L 51/004* (2013.01); *H01L 51/006* (2013.01); *H01L 51/0007* (2013.01); *H01L 51/0043* (2013.01); *H01L 51/0073* (2013.01); *C08K 5/0041* (2013.01); *H01L 27/322* (2013.01); *H01L 51/0058* (2013.01)

(58) Field of Classification Search
CPC ...... C08F 290/02; C08F 297/02; C08L 53/00; G02B 5/201; G02B 5/223; G02F 1/133514; H01L 51/0007; H01L 51/004; H01L 51/0043; H01L 51/006; H01L 51/0073; H01L 27/322; H01L 51/0058; C08K 5/0041

See application file for complete search history.

(56) References Cited

U.S. PATENT DOCUMENTS

| | | | |
|---|---|---|---|
| 2014/0039201 A1 | 2/2014 | Okada et al. | |
| 2015/0299364 A1 | 10/2015 | Omori et al. | |

FOREIGN PATENT DOCUMENTS

| | | |
|---|---|---|
| JP | 2001-081348 | 3/2001 |
| JP | 2010-026334 | 2/2010 |
| JP | 2010-083923 | 4/2010 |
| JP | 2012-252319 | 12/2012 |
| JP | 2013-230416 | 11/2013 |
| WO | 2012/144520 | 10/2012 |
| WO | 2012/144521 | 10/2012 |
| WO | 2014/061750 | 4/2014 |

NON-AQUEOUS DISPERSANT, COLOR MATERIAL DISPERSION LIQUID FOR COLOR FILTER, COLOR FILTER, LIQUID CRYSTAL DISPLAY DEVICE AND ORGANIC LIGHT-EMITTING DISPLAY DEVICE

TECHNICAL FIELD

The present invention relates to a non-aqueous dispersant, a color material dispersion liquid for a color filter, a color filter, a liquid crystal display device, and an organic light-emitting display device.

BACKGROUND ART

Many thin image display devices as typified by displays, i.e., flat panel displays, have been released on the market, because they are thinner than cathode-ray tube displays and they do not occupy much space in depth. Their market price has decreased year by year with advances in production techniques, resulting in a further increase in demand and a yearly increase in production. Especially, color LCD TVs have almost become the mainstream of TVs. Also in recent years, organic light-emitting display devices such as organic EL displays, which emit light by themselves and thereby have high visibility, have received attention as the next generation of image display devices. In relation to the performance of these image display devices, there is a strong demand for a further increase in image quality, such as an increase in contrast and color reproducibility, and a decrease in power consumption.

A color filter is used in these liquid crystal display devices and organic light-emitting display devices. For example, in the case of color LCDs, the amount of light is controlled by using a back light as the light source and electrically driving the liquid crystal. Colors are represented by the light that passed through the color filter. Accordingly, the color filter is indispensable for color representation in LCD TVs and plays a large role in determining display performance. In organic light-emitting display devices, a color image is formed in the same manner as liquid crystal display devices, when the color filter is used in combination with an organic, white light-emitting element.

A recent trend is that there is a demand for power-saving image display devices. To increase backlight use efficiency, there is a very high demand for high-luminance color filters. This is a major issue especially for mobile displays such as mobile phones, smart phones and tablet PCs.

Even though technological advances have increased battery capacity, there is still a limit on battery capacity of mobile devices. Meanwhile, there is a trend that power consumption has grown with the increase in screen size. Image display devices containing a color filter determine the design and performance of mobile terminal devices, because they are directly linked to the usable time and charging frequency of mobile terminal devices.

In general, a color filter has a transparent substrate, color layers made of color patterns of the three primary colors (red, green and blue), and a light shielding part formed on the transparent substrate so as to define each color pattern.

To form such color layers, a pigment dispersion method in which pigments with excellent heat resistance and light resistance are used as color materials, has been widely used. However, it is difficult for color filters produced by use of pigments to satisfy the latest demand for higher luminance.

As a means to achieve higher luminance, color resin compositions for color filters, which contain dyes, have been studied. Compared to pigments, dyes generally have a higher transmittance and are able to produce a high-luminance color filter. However, dyes are problematic in that they are inferior in heat resistance to pigments and the chromaticity is likely to change when they are heated at high temperature in color filter production process, for example. Also, regarding color resin compositions for color filters, there is also a demand for improvement in alkaline resistance that a coating film is not peeled off in an alkaline aqueous solution in production process.

As a means to improve various kinds of resistance properties of dyes, a method for producing a salt-forming dye is known.

For example, in Patent Literature 1, a colored photosensitive composition containing a dyed lake pigment is disclosed, and examples of the dyed lake pigment include known pigments identified by color index numbers. Also, in Patent Literature 2, a blue colored composition for a color filter, the composition including a coloring agent consisting of a copper phthalocyanine blue pigment and a metal lake pigment of a xanthene-based dye, is disclosed as a blue colored composition for a color filter, which is able to form a color filter having high luminosity and a wide color reproducing region. However, in color layers formed by using the colored compositions described in these Patent Literatures, heat resistance of the lake pigment is not sufficient.

In Patent Literature 3, as a colored composition capable of exhibiting superior chromaticity characteristics of dyes and lake pigments, even when being subjected to a high-temperature heating process, a colored composition characterized by including: a coloring agent including at least one kind selected from the group consisting of dyes and lake pigments; a polymer including a repeating unit derived from at least one kind selected from the group consisting of an ethylenically unsaturated monomer having a sulfonic group, an ethylenically unsaturated monomer having a phosphonooxy group, and salts thereof; and a crosslinking agent, is disclosed. However, in the technique of Patent Literature 3, as described in Comparative Example later, there is a problem in that dispersibility of the lake pigment is poor or heat resistance of the lake pigment is not sufficient, and alkaline resistance is also poor.

CITATION LIST

Patent Literature

Patent Literature 1: JP 2001-81348 A
Patent Literature 2: JP 2010-26334 A
Patent Literature 3: JP 2012-252319 A

SUMMARY OF INVENTION

Technical Problem

The present invention was achieved in light of the circumstances. An object of the present invention is to provide: a non-aqueous dispersant which is excellent in dispersibility and able to form a resin layer having excellent alkaline resistance; a color material dispersion liquid for a color filter which is excellent in dispersibility of a metal lake color material and able to form a high-luminance coating film having excellent heat resistance and excellent alkaline resistance; a high-luminance color filter having excellent heat resistance and excellent alkaline resistance; and a liquid crystal display device and an organic light-emitting display device each having the color filter.

Solution to Problem

The non-aqueous dispersant according to the present invention is a graft copolymer including a constitutional unit represented by the following general formula (II) and at least one kind selected from the group consisting of a constitutional unit represented by the following general formula (I) and a constitutional unit represented by the following general formula (I'), or a block copolymer including a block portion containing a constitutional unit represented by the following general formula (III) and a block portion containing at least one kind selected from the group consisting of a constitutional unit represented by the following general formula (I) and a constitutional unit represented by the following general formula (I').

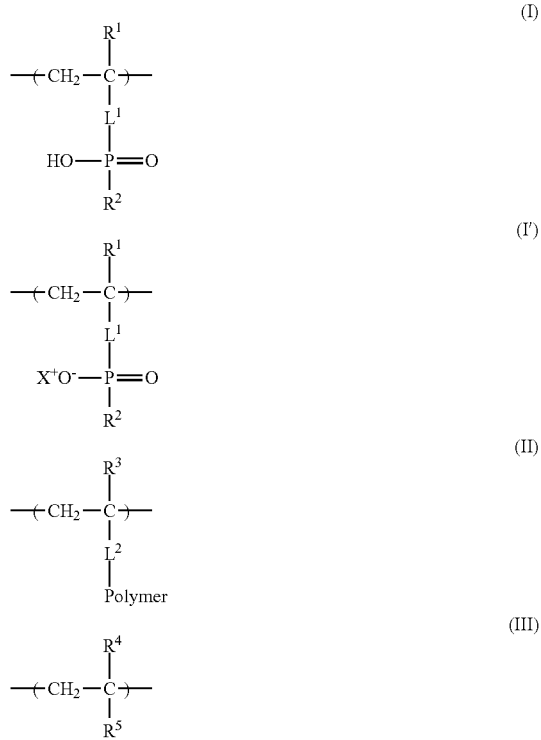

In the general formula (I) and the general formula (I'), L is a direct bond or a divalent linking group; $R^1$ is a hydrogen atom or a methyl group; $R^2$ is a hydrocarbon group or a monovalent group represented by —[CH($R^6$)—CH($R^7$)—O]$_{x1}$—$R^8$ or —[(CH$_2$)$_{y1}$—O]$_{z1}$—$R^8$; $R^6$ and $R^7$ are each independently a hydrogen atom or a methyl group; $R^8$ is a hydrogen atom, a hydrocarbon group, or a monovalent group represented by —CHO, —CH$_2$CHO, —CO—CH=CH$_2$, —CO—C(CH$_3$)=CH$_2$, or —CH$_2$COOR$^9$; $R^9$ is a hydrogen atom or an alkyl group having 1 to 5 carbon atoms; the hydrocarbon group can have a substituent group; x1 is an integer of 1 to 18; y1 is an integer of 1 to 5; and z1 is an integer of 1 to 18;

in the general formula (I'), $X^+$ is an organic cation;

in the general formula (II), $L^2$ is a direct bond or a divalent linking group; $R^3$ is a hydrogen atom or a methyl group; and "Polymer" is a polymer chain having at least one kind selected from the group consisting of a constitutional unit represented by the following general formula (IV) and a constitutional unit represented by the following general formula (V); and in the general formula (III), $R^4$ is a hydrogen atom or a methyl group; $R^5$ is a hydrocarbon group, or a monovalent group represented by —[CH($R^{10}$)—CH($R^{11}$)—O]$_{x2}$—$R^{12}$, —[(CH$_2$)$_{y2}$—O]$_{z2}$—$R^{12}$, —[CO—(CH$_2$)$_{y2}$—O]$_{z2}$—$R^{12}$, —CO—O—$R^{12'}$ or —O—CO—$R^{12''}$; $R^{10}$ and $R^{11}$ are each independently a hydrogen atom or a methyl group; $R^{12}$ is a hydrogen atom, a hydrocarbon group, or a monovalent group represented by —CHO, —CH$_2$CHO or —CH$_2$COOR$^{13}$; $R^{12'}$ is a hydrocarbon group, or a monovalent group represented by —[CH($R^{10}$)—CH($R^{11}$)—O]$_{x2}$—$R^{12}$, —[(CH$_2$)$_{y2'}$—O]$_{z2'}$—$R^{12}$, or —[CO—(CH$_2$)$_{2'}$—O]$_{z2'}$-$R^{12}$; $R^{12''}$ is an alkyl group having 1 to 18 carbon atoms; $R^{13}$ is a hydrogen atom or an alkyl group having 1 to 5 carbon atoms; the hydrocarbon groups can have a substituent group; x2 and x2' are each an integer of 1 to 18; y2 and y2' are each an integer of 1 to 5; and z2 and z2' are each an integer of 1 to 18;

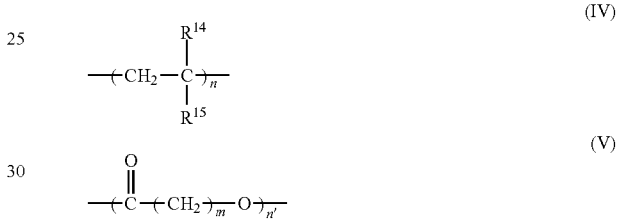

in the general formula (IV) and the general formula (V), $R^{14}$ is a hydrogen atom or a methyl group; $R^{15}$ is a hydrocarbon group, or a monovalent group represented by [CH($R^{16}$)—CH($R^{17}$)—O]$_{x3}$—$R^{18}$, —[(CH$_2$)$_{y3}$—O]$_{z3}$—$R^{18}$, —[CO—(CH$_2$)$_{y3}$—O]$_{z3}$—$R^{18}$, —CO—O—$R^{19}$ or —O—CO—$R^{20}$; $R^{16}$ and $R^{17}$ are each independently a hydrogen atom or a methyl group; $R^{18}$ is a hydrogen atom, a hydrocarbon group, or a monovalent group represented by —CHO, —CH$_2$CHO, or —CH$_2$COOR$^{21}$; $R^{19}$ is a hydrocarbon group, or a monovalent group represented by —[CH($R^{16}$)—CH($R^{17}$)—O]$_{x4}$—$R^{18}$, —[(CH$_2$)$_{y4}$—O]$_{z4}$—$R^{18}$ or —[CO—(CH$_2$)$_{y4}$—O]$_{z4}$—$R^{18}$; $R^{20}$ is an alkyl group having 1 to 18 carbon atoms; $R^{21}$ is a hydrogen atom or an alkyl group having 1 to 5 carbon atoms; the hydrocarbon group can have a substituent group; and m is an integer of 1 to 5; n and n' are each an integer of 5 to 200; x3 and x4 are each an integer of 1 to 18; y3 and y4 are each an integer of 1 to 5; and z3 and z4 are each an integer of 1 to 18.

The color material dispersion liquid for a color filter according to the present invention includes a color material (A), a dispersant (B), and a solvent (C), wherein the color material (A) contains a metal lake color material of a basic dye, and the dispersant (B) is a graft copolymer including a constitutional unit represented by the general formula (II) and at least one kind selected from the group consisting of a constitutional unit represented by the general formula (I) and a constitutional unit represented by the general formula (I'), or a block copolymer including a block portion containing a constitutional unit represented by the general formula (III) and a block portion containing at least one kind selected from the group consisting of a constitutional unit represented by the general formula (I) and a constitutional unit represented by the general formula (I').

The color material dispersion liquid for a color filter according to the present invention is particularly suitably used in a case where the metal lake color material of a basic dye is a metal lake color material of a xanthene-based basic dye. The inventors of the present invention achieved knowledge that, in a case where a metal lake color material of a xanthene-based basic dye such as C. I. Pigment Red 81 is used, as described in Comparative Example later, the lake color material is easily sublimated in a high-temperature heating process at the time of producing the color filter. However, according to the color material dispersion liquid for a color filter related to the present invention, sublimation of the metal lake color material of a xanthene-based basic dye in the high-temperature heating process can be inhibited.

In the color material dispersion liquid for a color filter according to the present invention, from the viewpoint of having high luminance and excellent heat resistance, it is preferable that the color material (A) contains a color material (A-1) represented by the following general formula (VI), and an anion in the color material (A-1) is a polyoxometalate anion containing at least tungsten.

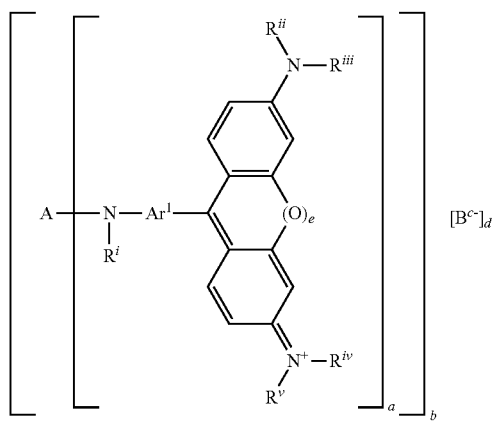

(VI)

In the general formula (VI), "A" is an "a"-valent organic group in which a carbon atom directly bound to "N" has no π bond, and the organic group is an aliphatic hydrocarbon group having a saturated aliphatic hydrocarbon group at least at a terminal position directly bound to "N", or an aromatic group having the aliphatic hydrocarbon group, and O, S, N can be contained in a carbon chain of the organic group; $B^{c-}$ is a "c"-valent polyoxometalate anion; each of $R^i$ to $R^v$ is independently a hydrogen atom, an alkyl group which can have a substituent group, or an aryl group which can have a substituent group; $R^{ii}$ and $R^{iii}$ can be bound to form a ring structure, and/or $R^{iv}$ and $R^v$ can be bound to form a ring structure; $Ar^1$ is a divalent aromatic group which can have a substituent group; a plurality of $R^i$s can be the same or different; a plurality of $R^{ii}$s can be the same or different; a plurality of $R^{iii}$s can be the same or different; a plurality of $R^{iv}$s can be the same or different; a plurality of $R^v$s can be the same or different; a plurality of $Ar^1$s can be the same or different;

"a" and "c" are each an integer of 2 or more, and "b" and "d" are each an integer of 1 or more; "e" is 0 or 1, and there is no bond when "e" is 0; and a plurality of "e"s can be the same or different.

The color filter according to the present invention is a color filter including at least a transparent substrate and color layers disposed on the transparent substrate, wherein at least one of the color layers contains a color material (A), and a dispersant (B), the color material (A) contains a metal lake color material of a basic dye, and the dispersant (B) is a graft copolymer including a constitutional unit represented by the general formula (II) and at least one kind selected from the group consisting of a constitutional unit represented by the general formula (I) and a constitutional unit represented by the general formula (I'), or a block copolymer including a block portion containing a constitutional unit represented by the general formula (III) and a block portion containing at least one kind selected from the group consisting of a constitutional unit represented by the general formula (I) and a constitutional unit represented by the general formula (I').

The liquid crystal display device according to the present invention includes the color filter according to the present invention, a counter substrate, and a liquid crystal layer disposed between the color filter and the counter substrate.

The organic light-emitting display device according to the present invention includes the color filter according to the present invention and an organic light-emitting material.

Advantageous Effects of Invention

According to the present invention, it is possible to provide: a non-aqueous dispersant which is excellent in dispersibility and able to form a resin layer having excellent alkaline resistance; a color material dispersion liquid for a color filter which is excellent in dispersibility of a metal lake color material and able to form a high-luminance coating film having excellent heat resistance and excellent alkaline resistance; a high-luminance color filter having excellent heat resistance and excellent alkaline resistance; and a liquid crystal display device and an organic light-emitting display device each having the color filter.

DESCRIPTION OF EMBODIMENTS

Figure 1:
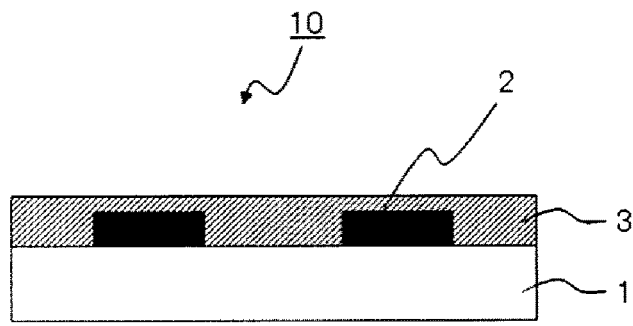
FIG. 1 is a schematic sectional view of an example of the color filter of the present invention.

Hereinafter, a non-aqueous dispersant, a color material dispersion liquid for a color filter, a color filter, a liquid crystal display device, and an organic light-emitting display device, which are according to the present invention, will be described in order.

Incidentally, in the present invention, "light" encompasses electromagnetic waves in visible and non-visible wavelength ranges and radial rays. Radial rays include microwaves and electron beams, for example. More specifically, "light" include electromagnetic waves having a wavelength of 5 μm or less and electron beams.

In the present invention, "(meth)acrylic" means any of acrylic and methacrylic, and "(meth)acrylate" means any of acrylate and methacrylate.

Also, in the present invention, "organic group" means a group having one or more carbon atoms.

1. Non-Aqueous Dispersant

The non-aqueous dispersant according to the present invention is a graft copolymer including a constitutional unit represented by the following general formula (II) and at least one kind selected from the group consisting of a constitutional unit represented by the following general formula (I) and a constitutional unit represented by the following general formula (I'), or a block copolymer including a block portion containing a constitutional unit represented by the following general formula (III) and a block portion containing at least one kind selected from the group consisting of a constitutional unit represented by the following general formula (I) and a constitutional unit represented by the following general formula (I').

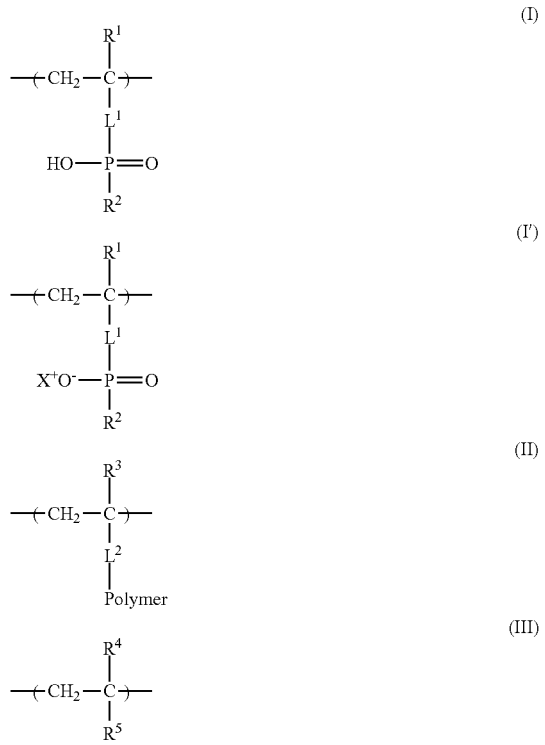

In the general formula (I) and the general formula (I'), $L^1$ is a direct bond or a divalent linking group; $R^1$ is a hydrogen atom or a methyl group; $R^2$ is a hydrocarbon group or a monovalent group represented by $-[CH(R^6)-CH(R^7)-O]_{x2}-R^8$ or $-[(CH_2)_{y1}-O]_{z1}-R^8$; $R^6$ and $R^7$ are each independently a hydrogen atom or a methyl group; $R^8$ is a hydrogen atom, a hydrocarbon group, or a monovalent group represented by $-CHO$, $-CH_2CHO$, $-CO-CH=CH_2$, $-CO-C(CH_3)=CH_2$, or $-CH_2COOR^9$; $R^9$ is a hydrogen atom or an alkyl group having 1 to 5 carbon atoms; the hydrocarbon group can have a substituent group; x1 is an integer of 1 to 18; y1 is an integer of 1 to 5; and z1 is an integer of 1 to 18;

in the general formula (I'), $X^i$ is an organic cation;

in the general formula (II), $L^2$ is a direct bond or a divalent linking group; $R^3$ is a hydrogen atom or a methyl group; and "Polymer" is a polymer chain having at least one kind selected from the group consisting of a constitutional unit represented by the following general formula (IV) and a constitutional unit represented by the following general formula (V); and in the general formula (III), $R^4$ is a hydrogen atom or a methyl group; $R^5$ is a hydrocarbon group, or a monovalent group represented by $-[CH(R^{10})-CH(R^{11})-O]_{x2}-R^{12}$, $-[(CH_2)_{y2}-O]_{z2}-R^{12}$, $-[CO-(CH_2)_{y2}-O]_{z2}-R^{12}$, $-CO-O-R^{12'}$ or $-O-CO-R^{12''}$; $R^{10}$ and $R^{11}$ are each independently a hydrogen atom or a methyl group; $R^{12}$ is a hydrogen atom, a hydrocarbon group, or a monovalent group represented by $-CHO$, $-CH_2CHO$ or $-CH_2COOR^{13}$; $R^{12'}$ is a hydrocarbon group, or a monovalent group represented by $-[CH(R^{10})-CH(R^{11})-O]_{x2'}-R^{12}$, $-[(CH_2)_{y2'}-O]_{z2'}-R^{12}$, or $-[CO-(CH_2)_{y2'}-O]_{z2'}-R^{12}$; $R^{12''}$ is an alkyl group having 1 to 18 carbon atoms; $R^{13}$ is a hydrogen atom or an alkyl group having 1 to 5 carbon atoms; the hydrocarbon groups can have a substituent group; x2 and x2' are each an integer of 1 to 18; y2 and y2' are each an integer of 1 to 5; and z2 and z2' are each an integer of 1 to 18.

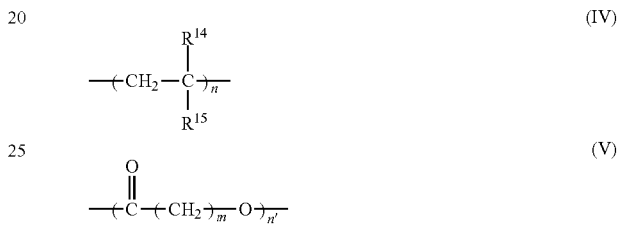

In the general formula (IV) and the general formula (V), $R^{14}$ is a hydrogen atom or a methyl group; $R^{15}$ is a hydrocarbon group, or a monovalent group represented by $[CH(R^{16})-CH(R^{17})-O]_{x3}-R^{18}$, $-[(CH_2)_{y3}-O]_{z3}-R^{18}$, $-[CO-(CH_2)_{y3}-O]_{z3}-R^{18}$, $-CO-O-R^{19}$ or $-O-CO-R^{20}$; $R^{16}$ and $R^{17}$ are each independently a hydrogen atom or a methyl group; $R^{18}$ is a hydrogen atom, a hydrocarbon group, or a monovalent group represented by $-CHO$, $-CH_2CHO$, or $-CH_2COOR^{21}$; $R^{19}$ is a hydrocarbon group, or a monovalent group represented by $-[CH(R^{16})-CH(R^{17})-O]_{x4}-R^{18}$, $-[(CH_2)_{y4}-O]_{z4}-R^{18}$ or $-[CO-(CH_2)_{y4}-O]_{z4}-R^{18}$; $R^{20}$ is an alkyl group having 1 to 18 carbon atoms; $R^{21}$ is a hydrogen atom or an alkyl group having 1 to 5 carbon atoms; the hydrocarbon group can have a substituent group; and m is an integer of 1 to 5; n and n' are each an integer of 5 to 200; x3 and x4 are each an integer of 1 to 18; y3 and y4 are each an integer of 1 to 5; and z3 and z4 are each an integer of 1 to 18.

The non-aqueous dispersant according to the present invention includes at least one kind selected from the group consisting of a constitutional unit represented by the general formula (I) and a constitutional unit represented by the following general formula (I'), and thus can improve dispersibility of particles of, for example, a color material and form a resin layer having excellent alkaline resistance.

Further, when a color material having low heat resistance, such as a lake color material, is dispersed, the non-aqueous dispersant according to the present invention has an effect of improving heat resistance of, particularly, a color layer using a color material dispersion liquid of the color material having low heat resistance, and inhibits a change in chromaticity of the color material even under high-temperature heating such as post-baking.

The inventors of the present invention achieved knowledge that, in a case where a metal lake color material of a xanthene-based basic dye such as C. I. Pigment Red 81 is used, as described in Comparative Example later, the lake color material is easily sublimated in a high-temperature heating process at the time of producing the color filter. When a metal lake pigment of a xanthene-based basic dye is used as a color material, spectroscopic properties of the color filter is excellent, but problems arise in that color transfer occurs in a furnace such as an oven at the time of post-baking to contaminate the inside of the furnace or a color material transferred to the inside of the furnace is further transferred to other color layer at the time of forming the other color layer so that luminance of the color layer is decreased. On the other hand, when the non-aqueous dispersant according to the present invention is used in combination with the metal lake color material of a xanthene-based basic dye, sublimation of the metal lake color material of a xanthene-based basic dye is inhibited so that color transfer described above is inhibited.

The reason why the non-aqueous dispersant according to the present invention has high dispersibility is presumed that an acidic phosphorus compound group (—P(=O)(—R$^2$)(OH)) and its salt (—P(=O)(—R$^2$)(O$^-$X$^+$)) of at least one kind selected from the group consisting of a constitutional unit represented by the general formula (I) and a constitutional unit represented by the general formula (I') have strong absorptivity to the particle surface of, for example, a color material to be dispersed and a graft chain or other block portion has high solubility in a non-aqueous solvent. For example, when the constitutional unit has a phosphonooxy group (—O—P(=O)(OH)$_2$) described in Comparative Example later, it is presumed that absorptivity to the particle surface of, for example, a color material is not sufficient, and thus dispersibility is decreased.

Further, the reason why the non-aqueous dispersant according to the present invention is able to form a resin layer having excellent alkaline resistance is presumed that the non-aqueous dispersant has a structure in which a carbon atom is directly bound to a phosphorus atom, and thus the non-aqueous dispersant is difficult to be hydrolyzed.

Furthermore, the reason why the non-aqueous dispersant according to the present invention has an effect of improving heat resistance of a color material having low heat resistance such as a lake color material is presumed that at least one kind of an acidic phosphorus compound group and a salt thereof are localized on the particle surface of the lake color material.

That is, as the lake color material is in a state where the surface thereof is coated with at least one kind of an acidic phosphorus compound group and a salt thereof, attacks on the dye skeleton of the lake pigment by active oxygen such as peroxy radical (hydrogen abstraction) are inhibited, deterioration of the color material (oxidation degradation) is inhibited, and sublimation of the dye is inhibited.

The reason why the non-aqueous dispersant according to the present invention has the high effect particularly in a metal lake color material of a basic dye is presumed that adsorption action of an acidic phosphorus compound group and a salt thereof with respect to a cationic portion of the basic dye is particularly strong.

(Graft Copolymer)

The graft copolymer has a constitutional unit represented by the general formula (II) and at least one kind selected from the group consisting of a constitutional unit represented by the general formula (I) and a constitutional unit represented by the general formula (I').

<Constitutional Unit Represented by General Formula (I) and Constitutional Unit Represented by General Formula (I')>

In the general formula (I) and the general formula (I'), $L^1$ is a direct bond or a divalent linking group. The direct bond means that a phosphorus atom is directly bound to a carbon atom of the main chain skeleton not through a linking group.

The divalent linking group as $L^1$ is not particularly limited as long as it is able to link the carbon atom of the main chain skeleton to the phosphorus atom. Examples of the divalent linking group as $L^1$ include a linear, branched, or cyclic alkylene group, a linear, branched, or cyclic alkylene group having a hydroxyl group, an arylene group, a —CONH— group, a —COO— group, a —NHCOO— group, an ether group (—O— group), a thioether group (—S— group) and combinations thereof. Incidentally, in the present invention, the binding direction of the divalent linking group can be any direction. That is, when —CONH— is contained in the divalent linking group, —CO can be located on the carbon atom side of the main chain and —NH can be located on the phosphorus atom side of the side chain. To the contrary, —NH can be located on the carbon atom side of the main chain and —CO can be located on the phosphorus atom side of the side chain.

Among these, from the viewpoint of dispersibility, $L^1$ in the general formula (I) and the general formula (I') is preferably a divalent linking group containing a —CONH— group or a —COO— group.

For example, when $L^1$ is a divalent linking group containing a —COO— group, the constitutional unit represented by the general formula (I) and the constitutional unit represented by the general formula (I') can be a structure represented by the following formula (I-1) and a structure represented by the following formula (I'-1), respectively.

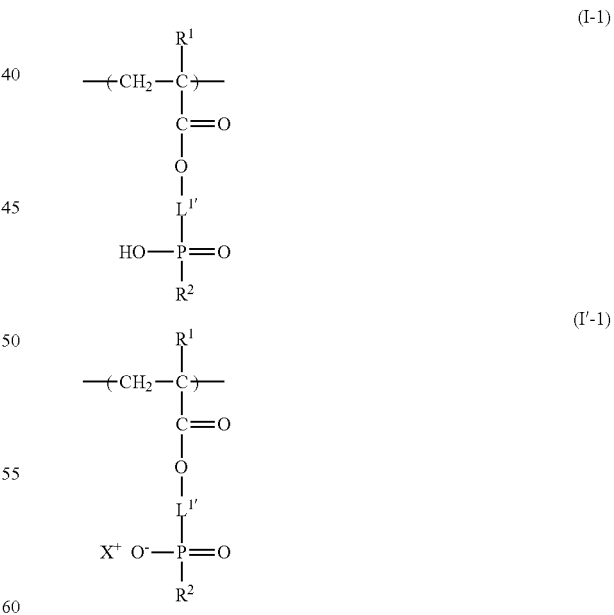

In the general formula (I-1) and the general formula (I'-1), $R^1$ and $R^2$ are the same as in the general formula (I) and the general formula (I'); $X^+$ is the same as in the general formula (I'); $L^{1'}$ is an alkylene group which has 1 to 8 carbon atoms and can have a hydroxyl group, —[CH(R$^a$)—CH(R$^b$)—O]$_x$—, —[(CH$_2$)$_y$—O]$_z$—(CH$_2$)$_y$—O—, or —[CH(R$^c$)]$_w$—

O—; $R^a$, $R^b$, and $R^c$ are each independently a hydrogen atom, a methyl group, or a hydroxyl group; x is an integer of 1 to 18; y is an integer of 1 to 5; z is an integer of 1 to 18; and w is an integer of 1 to 18.

The alkylene group having 1 to 8 carbon atoms as $L^{1'}$ can be any of linear, branched, and cyclic. Examples thereof include a methylene group, an ethylene group, a trimethylene group, a propylene group, various types of butylene groups, various types of pentylene groups, various types of hexylene groups, and various types of octylene groups. A part of hydrogen atoms of the alkylene group can be substituted with a hydroxyl group.

x is an integer of 1 to 18, preferably an integer of 1 to 4, and more preferably an integer of 1 to 2; and y is an integer of 1 to 5, preferably an integer of 1 to 4, and more preferably 2 or 3. z is an integer of 1 to 18, preferably an integer of 1 to 4, and more preferably an integer of 1 to 2. w is an integer of 1 to 18 and preferably an integer of 1 to 4.

Concrete examples of preferred $L^1$ in the general formula (I) and the general formula (I') include —COO—$CH_2CH(OH)CH_2$—O—, —COO—$CH_2CH_2$—O—$CH_2CH(OH)CH_2$—O—, and —COO—$CH_2C(CH_2CH_3)(CH_2OH)CH_2$—O—, and $L^1$ is not limited thereto.

Examples of the hydrocarbon group as $R^2$ include an alkyl group having 1 to 18 carbon atoms, an alkenyl group having 2 to 18 carbon atoms, an aralkyl group, and an aryl group.

The alkyl group having 1 to 18 carbon atoms can be linear, branched, or cyclic. Examples thereof include a methyl group, an ethyl group, an n-propyl group, an isopropyl group, an n-butyl group, a cyclopentyl group, a cyclohexyl group, a bornyl group, an isobornyl group, a dicyclopentanyl group, an adamantyl group, and a lower alkyl group-substituted adamantyl group.

The alkenyl group having 2 to 18 carbon atoms can be linear, branched, or cyclic. Examples of such an alkenyl group include a vinyl group, an allyl group, and a propenyl group. The position of the double bond of the alkenyl group is not limited. From the viewpoint of the reactivity of the resulting polymer, the double bond is preferably located at the terminal of the alkenyl group.

Examples of the aryl group include a phenyl group, a biphenyl group, a naphthyl group, a tolyl group, and a xylyl group. The aryl group can further have a substituent group. The number of carbon atoms of the aryl group is preferably 6 to 24 and more preferably 6 to 12.

Further, examples of the aralkyl group include a benzyl group, a phenethyl group, a naphthylmethyl group, and a biphenylmethyl group. The aralkyl group can further have a substituent group. The number of carbon atoms of the aralkyl group is preferably 7 to 20 and more preferably 7 to 14.

The alkyl group or alkenyl group can have a substituent group. Examples of the substituent group include a halogen atom, such as F, Cl, or Br, and a nitro group.

Further, examples of the substituent group of the aromatic ring of the aryl group or aralkyl group include a linear or branched alkyl group having 1 to 4 carbon atoms, an alkenyl group, a nitro group, and a halogen atom.

Incidentally, the preferable number of carbon atoms does not include the number of carbon atoms of the substituent group.

In $R^2$, x1 is the same as x, y1 is the same as y, and z1 is the same as z.

As the hydrocarbon group as $R^8$, for example, there may be mentioned the same hydrocarbon group as $R^2$ described above.

The constitutional unit represented by the general formula (I) is preferably such that $R^2$ in the general formula (I) is a methyl group, an ethyl group, an aryl group or aralkyl group which can have a substituent group, a vinyl group, an allyl group, or a monovalent group represented by [$CH(R^6)$—CH($R^7$)—O]$_{x1}$—$R^8$ or —[$(CH_2)_{y1}$—O]$_{z1}$—$R^8$; $R^6$ and $R^7$ are each independently a hydrogen atom or a methyl group; and $R^8$ is —CO—CH=$CH_2$ or —CO—C($CH_3$)=$CH_2$, from the viewpoint that excellent dispersibility and dispersion stability of particles to be dispersed can be obtained. Of them, from the viewpoint of dispersibility, an aryl group which can have a substituent group is more preferable.

The polymer can include only one kind of the constitutional unit represented by the general formula (I) or two or more kinds of the constitutional units represented by the general formula (I).

Further, in the general formula (I'), $X^+$ is an organic cation. The organic cation indicates those containing a carbon atom in a cationic portion. Examples of the organic cation include an imidazolium cation, a pyridinium cation, an amidinium cation, a piperidinium cation, a pyrrolidinium cation, ammonium cations such as a tetraalkylammonium cation and a trialkylammonium cation, sulfonium cations such as a trialkylsulfonium cation, and phosphonium cations such as a tetraalkylphosphonium cation. Of them, a protonated nitrogen-containing organic cation is preferable from the viewpoint of dispersibility and alkaline developability.

Of them, an organic cation having an ethylenically unsaturated double bond is preferable from the viewpoint of providing curing properties.

The constitutional unit represented by the general formula (I') is preferably such that $R^2$ in the general formula (I') is a methyl group, an ethyl group, an aryl group or aralkyl group which can have a substituent group, a vinyl group, an allyl group, or a monovalent group represented by [$CH(R^6)$—CH($R^7$)—O]$_{x1}$—$R^8$ or —[$(CH_2)_{y1}$—O]$_{z1}$—$R^8$; $R^6$ and $R^7$ are each independently a hydrogen atom or a methyl group; $R^8$ is —O—CH=$CH_2$ or —CO—C($CH_3$)=$CH_2$; and $X^+$ is a protonated nitrogen-containing organic cation, particularly, a protonated imidazolium cation, from the viewpoint that excellent dispersibility and dispersion stability of particles to be dispersed and excellent alkaline developability can be obtained. Of them, $R^2$ is more preferably an aryl group which can have a substituent group from the viewpoint of dispersibility.

The polymer can include only one kind of the constitutional unit represented by the general formula (I') or two or more kinds of the constitutional units represented by the general formula (I').

The non-aqueous dispersant of the present invention can include both constitutional units of the constitutional unit represented by the general formula (I) and the constitutional unit represented by the general formula (I'). When both of the constitutional units are contained, the proportion of the number of constitutional units represented by the general formula (I') is not particularly limited as long as favorable dispersibility and dispersion stability can be exhibited. The proportion of the number of constitutional units represented by the general formula (I') is preferably 0 to 50 mol % with respect to the total number of the constitutional units of the constitutional unit represented by the general formula (I) and the constitutional unit represented by the general formula (I').

<Constitutional Unit Represented by General Formula (II)>

The graft copolymer has the constitutional unit represented by the general formula (II), and thus favorable solvent affinity can be obtained, and favorable particle dispersibility and dispersion stability can be obtained.

In the general formula (II), $L^2$ is a direct bond or a divalent linking group. The divalent linking group as $L^2$ is not particularly limited as long as it is able to link the carbon atom derived from the ethylenically unsaturated double bond to the polymer chain. Examples of the divalent linking group as $L^2$ include the same divalent linking group as $L^1$ described above.

In the general formula (II), "Polymer" is a polymer chain having at least one constitutional unit represented by the general formula (IV) or (V).

In the formula (IV), $R^{14}$ is a hydrogen atom or a methyl group, and $R^{15}$ is a hydrocarbon group or a monovalent group represented by $-[CH(R^{16})-CH(R^{17})-O]_{x3}-R^{18}$, $-[(CH_2)_{y3}-O]_{z3}-R^{18}$, $-[CO-(CH_2)_{y3}-O]_{z3}-R^{18}$, $-CO-O-R^{19}$ or $-O-CO-R^{20}$.

The hydrocarbon group as $R^{15}$ is preferably an alkyl group having 1 to 18 carbon atoms, an alkenyl group having 2 to 18 carbon atoms, an aralkyl group, or an aryl group. As these groups, for example, there may be mentioned the same examples as in $R^2$ described above.

$R^{18}$ is a hydrogen atom, an alkyl group having 1 to 18 carbon atoms, an aralkyl group, an aryl group, or a monovalent group represented by $-CHO$, $-CH_2CHO$, or $-CH_2COOR^{21}$. $R^{19}$ is an alkyl group having 1 to 18 carbon atoms, an aralkyl group, an aryl group, or a monovalent group represented by $-[CH(R^{16})-CH(R^{17})-O]_{x4}-R^{18}$, $-[(CH_2)_{y4}-O]_{z4}-R^{18}$, or $-[CO-(CH_2)_{y4}-O]_{z4}-R^{18}$. $R^{20}$ is an alkyl group having 1 to 18 carbon atoms, and $R^{21}$ is a hydrogen atom or an alkyl group having 1 to 5 carbon atoms.

The alkyl group having 1 to 18 carbon atoms, the aralkyl group, and the aryl group as $R^{18}$ and $R^{19}$ can be the same as that described in $R^2$.

The alkyl group as $R^{20}$ and $R^{21}$ can be the same as that described in $R^2$.

When $R^{15}$, $R^{18}$, $R^{19}$ and $R^{20}$ are each a group having an aromatic ring, the aromatic ring can further have a substituent group. Examples of the substituent group include a linear, branched, or cyclic alkyl group having 1 to 5 carbon atoms, an alkenyl group, a nitro group, and a halogen atom such as F, Cl, or Br.

Incidentally, the preferable number of carbon atoms does not include the number of carbon atoms of the substituent group.

In $R^{15}$ and $R^{19}$, x3 and x4 are the same as x, y3 and y4 are the same as y, and z3 and z4 are the same as z.

Further, $R^{15}$, $R^{18}$, $R^{19}$, and $R^{20}$ can be further substituted with a substituent group such as an alkoxy group, a hydroxyl group, a carboxyl group, an amino group, an epoxy group, an isocyanate group, or a hydrogen bond-forming group, to the extent that does not impair the dispersion performance and so on of the graft copolymer. In addition, after synthesizing the graft copolymer having such a substituent group, a polymerizable group may be added thereto by reaction with a compound having a functional group that is reactive with the substituent group and the polymerizable group. For example, a polymerizable group can be added by reacting the graft copolymer having a carboxyl group with glycidyl (meth)acrylate, or reacting the graft copolymer having an isocyanate group with hydroxyethyl (meth)acrylate.

Of the above-described constitutional units, the polymer chain contained in the constitutional unit represented by the general formula (IV) preferably has a constitutional unit derived from, but not limited to, methyl (meth)acrylate, ethyl (meth)acrylate, isopropyl (meth)acrylate, n-butyl (meth)acrylate, isobutyl (meth)acrylate, tert-butyl (meth)acrylate, 2-ethylhexyl (meth)acrylate, 2-ethoxyethyl (meth)acrylate, cyclohexyl (meth)acrylate, benzyl (meth)acrylate, phenyl (meth)acrylate, isobornyl (meth)acrylate, dicyclopentanyl (meth)acrylate, adamantyl (meth)acrylate, styrene, α-methylstyrene, or vinylcyclohexane.

In the general formula (V), m is an integer of 1 to 5, preferably an integer of 2 to 5, and more preferably an integer of 4 or 5. Further, the unit numbers n and n' of the constitutional unit of the polymer chain may be each an integer of 5 to 200 and are not particularly limited. However, they are preferably in a range of 5 to 100.

In the present invention, as $R^{15}$ and $R^{19}$, it is preferable to use a group that has excellent solubility in the be low-described organic solvent, and $R^{15}$ and $R^{19}$ can be appropriately selected depending on the organic solvent used for the color material dispersion liquid. Specifically, for example, when the organic solvent is an organic solvent that is generally used for the color material dispersion liquid, such as an ether alcohol acetate-based organic solvent, an ether-based organic solvent, or an ester-based organic solvent, $R^{15}$ and $R^{19}$ are preferably a methyl group, an ethyl group, an isobutyl group, an n-butyl group, a 2-ethylhexyl group, or a benzyl group.

Herein, the reason why $R^{15}$ and $R^{19}$ are determined in this way is that particularly excellent dispersibility and dispersion stability of particles of, for example, a color material can be obtained when the constitutional unit containing $R^{15}$ and $R^{19}$ has solubility in the organic solvent and the acidic phosphorus compound group and its salt site of the monomer have high adsorption properties to particles of, for example, a color material.

The mass average molecular weight Mw of the polymer chain as the "Polymer" is preferably in a range of 500 to 15,000 and more preferably in a range of 1,000 to 8,000. When the mass average molecular weight is in the above range, the dispersant can keep a sufficient steric repulsion effect, and prevent an increase in the time required for dispersion of the particles of, for example, a color material by steric effects.

Further, as an indication, it is preferable that the polymer chain as the "Polymer" has a solubility of 50 (g/100 g solvent) or more at 23° C. in the organic solvent used in combination.

The solubility of the polymer chain can be determined by whether or not the raw material which is used for introducing the polymer chain when preparing the graft copolymer has the above solubility. For example, when a polymerizable oligomer containing a polymer chain and a group having an ethylenically unsaturated double bond at a terminal of the chain is used for introducing a polymer chain into the graft copolymer, the polymerizable oligomer can have the above solubility. Further, when a copolymer is formed by monomers each containing a group having an ethylenically unsaturated double bond, and then a polymer chain is introduced into the graft copolymer by a polymer chain having a reactive group that is reactive with the reactive group contained in the copolymer, the polymer chain having the reactive group can have the above solubility.

The polymer chain can be a homopolymer or copolymer. Further, in the graft copolymer, the polymer chain contained in the constitutional unit represented by the general formula (II) may be one kind of polymer chain or a combination of two or more kinds of polymer chains.

In the graft copolymer, the total content of the constitutional unit represented by the general formula (I) and the constitutional unit represented by the general formula (I') is preferably 3 to 80% by mass, more preferably 5 to 50% by mass, and even more preferably 10 to 40% by mass. When the total content of the constitutional unit represented by the general formula (I) and the constitutional unit represented by the general formula (I') is in the above range, the content of the site with an affinity for the particles in the graft copolymer can be appropriate, and a decrease in the solubility in the organic solvent can be inhibited. Therefore, favorable adsorption properties to the particles of, for example, a color material can be obtained, and favorable dispersibility and excellent dispersion stability can be obtained.

On the other hand, in the graft copolymer, the content of the constitutional unit represented by the general formula (II) is preferably 20 to 97% by mass, more preferably 50 to 95% by mass, and even more preferably 60 to 90% by mass.

Incidentally, the content ratios of the constitutional units are calculated from the amounts of the constitutional units used to synthesize the graft copolymer including the constitutional unit represented by the general formula (II) and at least one kind selected from the group consisting of the constitutional unit represented by the general formula (I) and the constitutional unit represented by the general formula (I').

Further, the mass average molecular weight Mw of the graft copolymer is preferably in a range of 1,000 to 100,000, more preferably in a range of 3,000 to 30,000, and even more preferably in a range of 5,000 to 20,000. When the mass average molecular weight is in the above range, the particles of, for example, a color material can be homogeneously dispersed.

Incidentally, in the present invention, the mass average molecular weight Mw is a value measured by gel permeation chromatography (GPC). The measurement is carried out by using HLC-8120GPC manufactured by Tosoh Corporation and the following: the elution solvent used is N-methylpyrrolidone added with 0.01 mol/liter lithium bromide; the polystyrene standards for calibration curve used are Mw 377400, 210500, 96000, 50400, 20650, 10850, 5460, 2930, 1300, and 580 (all are Easi PS-2 series manufactured by Polymer Laboratories) and Mw 1090000 (manufactured by Tosoh Corporation); and the measurement columns used are two TSK-GEL ALPHA-M columns (manufactured by Tosoh Corporation).

In addition to the constitutional unit represented by the general formula (I), the constitutional unit represented by the general formula (I'), and the constitutional unit represented by the general formula (II), the graft copolymer used in the present invention may further have other constitutional unit.

Other constitutional unit can be introduced by appropriately selecting an ethylenically unsaturated double bond-containing monomer, which is copolymerizable with, for example, an ethylenically unsaturated double bond-containing monomer that derives at least one kind selected from the group consisting of the constitutional unit represented by the general formula (I) and the constitutional unit represented by the general formula (I'), and copolymerizing them.

(Method for Producing Graft Copolymer)

In the present invention, the method for producing the graft copolymer is not particularly limited as long as it is a method that is able to produce a graft copolymer including the constitutional unit represented by the general formula (II) and at least one kind selected from the group consisting of the constitutional unit represented by the general formula (I) and the constitutional unit represented by the general formula (I'). When a graft copolymer including the constitutional unit represented by the general formula (I) and the constitutional unit represented by the general formula (II) is produced, for example, there may be mentioned a method for producing a graft copolymer by copolymerizing a monomer represented by the following general formula (Ia) and a polymerizable oligomer including a polymer chain having at least one constitutional unit represented by the general formula (IV) or (V), and a group having an ethylenically unsaturated double bond at a terminal of the chain, which are contained as copolymerizable components, or a method of obtaining the constitutional unit represented by the general formula (I) by copolymerizing a monomer that derives the constitutional unit represented by the general formula (II) and a monomer having a reactive group such as a glycidyl group and then adding an organic phosphonic acid ($R^2P(=O)(OH)^2$) having a desired structure to the constitutional unit derived from the monomer having a reactive group. Further, when a graft copolymer including the constitutional unit represented by the general formula (I') and the constitutional unit represented by the general formula (II) is produced, there may be mentioned a method of obtaining the constitutional unit represented by the general formula (I') by producing a graft copolymer including the constitutional unit represented by the general formula (I) and the constitutional unit represented by the general formula (II), further adding a salt forming agent containing an organic cation, and heating and stirring the mixture as needed so that a salt is formed between the acidic phosphorus compound group of the constitutional unit represented by the general formula (I) and the organic cation. The salt forming agent may be appropriately selected depending on an organic cation to be introduced. For example, when a protonated nitrogen-containing organic cation is introduced as an organic cation, various tertiary amine compounds or imidazole compounds corresponding to the protonated nitrogen-containing organic cation can be used. The added amount of the salt forming agent may be determined such that favorable dispersibility and dispersion stability can be exhibited, and may be appropriately adjusted depending on the content of the constitutional unit to be introduced. In general, the added amount of the salt forming agent is about 0.05 to 1.00 molar equivalent and preferably 0.3 to 0.5 molar equivalent with respect to the phosphorus moiety contained in the constitutional unit represented by the general formula (I).

A graft copolymer can be produced by using other monomer as needed, and by using a known polymerization means.

(Ia)

In the general formula (Ia), $R^1$, $R^2$, and $L^1$ have the same as in the general formula (I).

When a graft copolymer including the constitutional unit represented by the general formula (I) and the constitutional unit represented by the general formula (II) is produced, after a copolymer is formed by addition polymerization of the monomer represented by the general formula (Ia) and other monomer containing a group having an ethylenically unsaturated double bond, a polymer chain may be introduced into the copolymer by using a polymer chain containing a reactive group that is reactive with the reactive group contained in the copolymer. Specifically, for example, after a copolymer including a substituent group such as an alkoxy group, a hydroxyl group, a carboxyl group, an amino group, an epoxy group, an isocyanate group, or a hydrogen bond-forming group is synthesized, a polymer chain may be introduced into the copolymer by reacting the substituent group with a polymer chain containing a functional group that is reactive with the substituent group.

For example, a polymer chain can be introduced by reacting a copolymer having a glycidyl group at a side chain thereof with a polymer chain having a carboxyl group at the terminal thereof, or by reacting a copolymer having an isocyanate group at a side chain thereof with a polymer chain having a hydroxy group at the terminal thereof.

Incidentally, in the polymerization, additives that are generally used for polymerization, such as a polymerization initiator, a dispersion stabilizer, and a chain transfer agent, may be used.

Examples of the method for producing the monomer represented by the general formula (Ia) include a method of reacting an organic phosphonic acid compound having a desired structure with a compound having an ethylenically unsaturated double bond, and, for example, a glycidyl group, an alicyclic epoxy group, an oxetane group, or a hydroxyl group.

(Block Copolymer)

The block copolymer has a block portion containing a constitutional unit represented by the general formula (III) and a block portion containing at least one kind selected from the group consisting of a constitutional unit represented by the general formula (I) and a constitutional unit represented by the general formula (I').

<Block Portion Containing at Least One Kind Selected from the Group Consisting of a Constitutional Unit Represented by the General Formula (I) and a Constitutional Unit Represented by the General Formula (I')>

The block copolymer has a block portion containing at least one kind selected from the group consisting of a constitutional unit represented by the general formula (I) and a constitutional unit represented by the general formula (I'). The constitutional unit represented by the general formula (I) and the constitutional unit represented by the general formula (I') will not be described below, since they are as described above.

The total number of the constitutional unit represented by the general formula (I) and the constitutional unit represented by the general formula (I') contained in the block copolymer including a block portion containing at least one kind selected from the group consisting of a constitutional unit represented by the general formula (I) and a constitutional unit represented by the general formula (I') is preferably three or more. From the viewpoint of obtaining favorable dispersibility and improving heat resistance, the total number of the constitutional units contained in the block portion is preferably 3 to 200, more preferably 3 to 50, and even more preferably 3 to 30.

At least one kind selected from the group consisting of a constitutional unit represented by the general formula (I) and a constitutional unit represented by the general formula (I') may function as a site with an affinity for the color material. The constitutional units contained in the block portion can be one kind of constitutional units or two or more kinds of constitutional units. When two or more kinds of constitutional units are contained, the two or more kinds of constitutional units can be randomly arranged inside the block portion having a block portion containing at least one kind selected from the group consisting of a constitutional unit represented by the general formula (I) and a constitutional unit represented by the general formula (I').

The total content ratio of the constitutional unit represented by the general formula (I) and the constitutional unit represented by the general formula (I') in the block copolymer is preferably 5 to 60% by mass and more preferably 10 to 40% by mass when the total of the constitutional units in the block copolymer is considered to 100% by mass.

Incidentally, the content ratio of the constitutional units is calculated from the amount of the constitutional units used to synthesize the block copolymer.

<Block Portion Containing a Constitutional Unit Represented by the General Formula (III)>

When the block copolymer has a block portion containing a constitutional unit represented by the general formula (III), favorable solvent affinity can be obtained, favorable dispersibility and dispersion stability of the color material can be obtained, and favorable heat resistance can also be obtained.

In the general formula (III), $R^5$ is a hydrocarbon group or a monovalent group represented by $—[CH(R^{10})—CH(R^{11})—O]_{x2}—R^{12}$, $—[(CH_2)_{y2}—O]_{z2}—R^{12}$, $—[CO—(CH_2)_{y2}—O]_{z2}—R^{12}$, $—CO—O—R^{12'}$ or $—O—CO—R^{12''}$.

The hydrocarbon group as $R^5$ can be the same as that described in $R^2$.

Further, $R^{12}$ is a hydrogen atom, a hydrocarbon group, or a monovalent group represented by $—CHO$, $—CH_2CHO$, or $—CH_2COOR^{13}$; $R^{12'}$ is a hydrocarbon group or a monovalent group represented by $—[CH(R^{10})—CH(R^{11})—O]_{x2'}—R^{12}$, $—[(CH_2)_{y2'}—O]_{z2'}—R^{12}$, or $—[CO—(CH_2)_{y2'}-O]_{z2'}-R^{12}$; $R^{12''}$ is an alkyl group having 1 to 18 carbon atoms; $R^{13}$ is a hydrogen atom or an alkyl group having 1 to 5 carbon atoms; and the hydrocarbon group can have a substituent group.

The hydrocarbon group as $R^{12}$ can be the same as that described in $R^2$.

In $R^5$ and $R^{12'}$, x2 and x2' are the same as x, y2 and y2' are the same as y, and z2 and z2' are the same as z.

Further, $R^5$s in the constitutional unit represented by the general formula (III) can be the same as each other or different from each other.

As $R^5$, particularly, it is preferable to use a group with excellent solubility in a solvent described below, and for example, there may be mentioned the same one as $R^{15}$.

Further, $R^5$ can be substituted with a substituent group such as an alkoxy group, a hydroxyl group, a carboxyl group, an amino group, an epoxy group, an isocyanate group, or a hydrogen bond-forming group, to the extent that does not impair the dispersion performance and so on of the block copolymer. Also, after the synthesis of the block copolymer, the substituent group can be added thereto by reaction with a compound having the substituent group. Also, after the synthesis of the block copolymer having such a substituent group, $R^5$ can be reacted with a compound having a functional group that is reactive with the substituent group and a polymerizable group so as to add the polymerizable group thereto. For example, a polymerizable group can be added by reaction of a block copolymer having a glycidyl group with (meth)acrylate, or by reaction with a block copolymer having an isocyanate group with hydroxyethyl (meth)acrylate.

The number of the constitutional units constituting the block portion containing the constitutional unit represented by the general formula (III) is not particularly limited. From the viewpoint of allowing the site with an affinity for solvent and the site with an affinity for the color material to work effectively and improving the dispersibility of the color material dispersion liquid, it is preferably 10 to 200, more preferably 10 to 100, and even more preferably 10 to 70.

In the block copolymer, the content ratio of the constitutional unit represented by the general formula (III) is preferably 40 to 95% by mass and more preferably 60 to 90% by mass or more when the total of the constitutional units in the block copolymer is considered to 100% by mass.

Incidentally, the content ratio of the constitutional units is calculated from the amount of the constitutional units used to synthesize the block copolymer.

The block portion comprising the constitutional unit represented by the general formula (III) may be selected so as to function as a site with affinity for solvent. The constitutional units represented by the general formula (III) can be one kind of constitutional units or two or more kinds of constitutional units. In the present invention, when two or more kinds of constitutional units represented by the general formula (III) are contained, the two or more kinds of constitutional units can be randomly arranged inside the block portion having a block portion containing the constitutional unit represented by the general formula (III).

In the block copolymer serving as the dispersant, from the viewpoint of color material dispersibility and dispersion stability, the ratio m/n is preferably in a range of 0.01 to 1, more preferably in a range of 0.05 to 0.7, in which "m" is the unit number of the constitutional units constituting the block portion containing at least one selected from the group consisting of the constitutional unit represented by the general formula (I) and the constitutional unit represented by the general formula (I'), and "n" is the unit number of the constitutional units constituting the block portion containing the constitutional unit represented by the general formula (III).

The binding order of the block portions is not particularly limited, as long as the block portion containing the constitutional unit represented by the general formula (III) and the block portion containing at least one selected from the group consisting of the constitutional unit represented by the general formula (I) and the constitutional unit represented by the general formula (I') are contained therein and the color material can be stably dispersed. From the viewpoint of excellent interaction with the color material and effectively preventing the dispersants from aggregation, it is preferable that the block portion containing at least one selected from the group consisting of the constitutional unit represented by the general formula (I) and the constitutional unit represented by the general formula (I') is bound to only one terminal of the block copolymer.

The mass average molecular weight of the block copolymer is not particularly limited. From the viewpoint of being good in dispersibility and excellent in heat resistance, it is preferably 2,500 to 20,000, more preferably 3,000 to 12,000, and even more preferably 5,000 to 10,000.

(Method for Producing Block Copolymer)

In the present invention, the method for producing the block copolymer is not particularly limited as long as it is a method that is able to produce a block copolymer including the block portion containing the constitutional unit represented by the general formula (III) and the block portion containing at least one kind selected from the group consisting of the constitutional unit represented by the general formula (I) and the constitutional unit represented by the general formula (I'). When a block copolymer including the constitutional unit represented by the general formula (I) and the constitutional unit represented by the general formula (III) is produced, for example, there may be mentioned a method for producing a block copolymer by copolymerizing a monomer represented by the general formula (Ia) and a monomer that derives the constitutional unit represented by the general formula (III) by using a known polymerization means such as living polymerization, or a method of obtaining the constitutional unit represented by the general formula (I) by copolymerizing a monomer having a reactive group such as a glycidyl group, an alicyclic epoxy group, an oxetane group, or a hydroxyl group, and an ethylenically unsaturated double bond and a monomer that derives the constitutional unit represented by the general formula (III) by using a known polymerization means such as living polymerization to synthesize a block copolymer, and then adding an organic phosphonic acid ($R^2P(=O)(OH)^2$) having a desired structure to the constitutional unit derived from the monomer having a reactive group.

Further, when a block copolymer including the constitutional unit represented by the general formula (I') and the constitutional unit represented by the general formula (III) is produced, there may be mentioned a method of obtaining the constitutional unit represented by the general formula (I') by producing a block copolymer including the constitutional unit represented by the general formula (I) and the constitutional unit represented by the general formula (III), further adding a salt forming agent containing an organic cation, and heating and stirring the mixture as needed so that a salt is formed between the acidic phosphorus compound group of the constitutional unit represented by the general formula (I) and the organic cation. As the salt forming agent, the same salt forming agent used in the production of the graft copolymer can be used, and the content ratio of the salt forming agent can be set to the same content ratio as in the production of the graft copolymer.

Particles that are dispersible with the dispersant according to the present invention are not limited to the be low-described color material. The dispersant of the present invention is able to appropriately disperse metal particles, metal oxides, and pigments, for example. Further, in the dispersant of the present invention, the constitutional unit represented by the general formula (I) and the constitutional unit represented by the general formula (I') have high affinity for particles to be dispersed. Therefore, for example, when a color material is dispersed, excellent dispersibility and dispersion stability of the color material can be obtained, and oxidation-induced color deterioration can be prevented.

2. Color Material Dispersion Liquid for a Color Filter

The color material dispersion liquid for a color filter according to the present invention includes a color material (A), a dispersant (B), and a solvent (C), wherein the color material (A) contains a metal lake color material of a basic dye, and the dispersant (B) is a graft copolymer including a constitutional unit represented by the general formula (II) and at least one kind selected from the group consisting of a constitutional unit represented by the general formula (I) and a constitutional unit represented by the general formula (I'), or a block copolymer including a block portion containing a constitutional unit represented by the general formula (III) and a block portion containing at least one kind selected from the group consisting of a constitutional unit represented by the general formula (I) and a constitutional unit represented by the general formula (I').

The color material dispersion liquid for a color filter according to the present invention is excellent in dispersibility of a metal lake color material and able to form a high-luminance coating film having excellent heat resistance and excellent alkaline resistance. In the color material dispersion liquid for a color filter according to the present invention, at least one kind of an acidic phosphorus compound group and a salt thereof of at least one kind selected from the group consisting of the constitutional unit represented by the general formula (I) and the constitutional unit represented by the general formula (I') of the specific dispersant (B) are adsorbed to the cationic portion of the basic dye and the particle surface of the color material is covered with the dispersant (B). Therefore, it is presumed that dispersibility and dispersion stability of the color material are improved and sublimation thereof is inhibited. According to this, it is considered that a high-luminance coating film which is excellent in heat resistance and alkaline resistance can be formed.

In the color material dispersion liquid for a color filter according to the present invention, the color material (A) is dispersed in the solvent (C) by the dispersant (B) and used.

Hereinafter, respective components contained in the color material dispersion liquid for a color filter according to the present invention will be described in order. The dispersant (B) will not be described below, since the non-aqueous dispersant according to the present invention can be used as the dispersant (B).

(A) Color Material

The color material (A) used in the present invention contains a metal lake color material of a basic dye. The metal lake color material of a basic dye is composed of a cationic portion of a basic dye and an anionic portion of a metal laking agent.

The basic dye is an ionic dye in which the cationic portion becomes a chromophore, and examples thereof include azine-based dyes, oxazine-based dyes, thiazine-based dyes, azo-based dyes, anthraquinone-based dyes, xanthene-based dyes, triarylmethane-based dyes, phthalocyanine-based dyes, auramine-based dyes, acridine-based dyes, and methine-based dyes. Specifically, there may be mentioned those identified by color index (C. I.) names as described below.

Azine-based dyes such as C. I. Basic Red 2, 5, 6, or 10, C. I. Basic Violet 5, 6, 8, or 12, and C. I. Basic Yellow 14;

Oxazine-based dyes such as C. I. Basic Blue 3, 6, 10, 12, 74, and 122;

Thiazine-based dyes such as C. I. Basic Blue 9, 17, or 24, and C. I. Basic Green 5;

Azo-based dyes such as C. I. Basic Red 18, 22, 23, 24, 29, 30, 31, 32, 34, 38, 39, 46, 51, 53, 54, 55, 62, 64, 76, 94, 111, or 118, C. I. Basic Blue 41, 53, 54, 55, 64, 65, 66, 67, or 162, C. I. Basic Violet 15, 16, 18, 21, 22, or 36, C. I. Basic Yellow 15, 19, 24, 25, 28, 29, 38, 39, 49, 51, 52, 53, 57, 62, or 73, and C. I. Basic Orange 1, 2, 24, 25, 29, 30, 33, 54, or 69;

Anthraquinone-based dyes such as C. I. Basic Blue 22, 44, 47, and 72;

Xanthene-based dyes such as C. I. Basic Red 1, 1:1, 3, 4, 8, or 11, and C. I. Basic Violet 10, 11, or 11:1;

Triarylmethane-based dyes such as C. I. Basic Red 9, C. I. Basic Blue 1, 2, 5, 7, 8, 11, 15, 18, 20, 23, 26, 35, or 81, C. I. Basic Violet 1, 2, 3, 4, 14, or 23, and C. I. Basic Green 1 or 4;

Phthalocyanine-based dyes such as C. I. Basic Blue 140; Auramine-based dyes such as C. I. Basic Yellow 2, 3, and 37;

Acridine-based dyes such as C. I. Basic Yellow 5, 6, 7, or 9, and C. I. Basic Orange 4, 5, 14, 15, 16, 17, 18, 19, or 2; and Methine-based dyes such as C. I. Basic Red 12, 13, 14, 15, 27, 28, 37, 52, or 90, C. I. Basic Blue 62 or 63, C. I. Basic Yellow 11, 13, 21, 22, 28, 29, 49, 51, 52, or 53, and C. I. Basic Violet 7, 15, 16, 20, 21, or 22.

The metal leaking agent is not particularly limited as long as a metal is contained in the anionic portion, and examples thereof include anions of an oxo acid such as a chromate ion, a tungstate ion ($WO_4^{2-}$), and a molybdate ion ($MoO_4^{2-}$), and polyoxometalate anions. Of them, polyoxometalate anions are preferable from the viewpoint of improving heat resistance and light resistance. Incidentally, polyacid is an acid obtained by condensation of oxo acids. The polyoxometalate anions may be an isopolyoxometalate ion $(M_mO_n)^{d-}$ or a heteropolyoxometalate ion $(X_1M_mO_n)^{d-}$. In the above ionic formula, M is a poly atom, X is a hetero atom, m represents a composition ratio of the poly atom, and n represents a composition ratio of the oxygen atom. Examples of the poly atom "M" include Mo, W, V, Ti, and Nb. Examples of the hetero atom "X" include Si, P, As, S, Fe, and Co. Also, a counter cation such as $Na^+$ or $H^+$ may be contained in a part of the polyoxometalate anion.

Of them, a polyoxometalate anion containing at least one of tungsten (W) and molybdenum (Mo) is preferably used. Examples of such a polyoxometalate anion include a tungstate ion $[W_{10}O_{32}]^{4-}$, phosphotungstate ions $[PW_{12}O_{40}]^{3-}$ and $[P_2W_{18}O_{62}]^{6-}$, a silicotungstate ion $[SiW_{12}O_{40}]^{4-}$, a silicomolybdate ion $[SiMo_{12}O_{40}]^{4-}$, phosphotungstic molybdate ions $[PW_{12-x}Mo_xO_{40}]^{3-}$ (x is an integer of 1 to 11) and $[P_2W_{18-y}Mo_yO_{62}]^{6-}$ (y is an integer of 1 to 17), and a silicotungstic molybdate ion $[SiW_{12-x}Mo_xO_{40}]^{4-}$ (x is an integer of 1 to 11), but the polyoxometalate anion is not limited thereto. Of them, from the viewpoint of heat resistance, heteropolyoxometalate containing phosphorus (P) is further preferable.

As the metal lake color material of a basic dye, for example, there may be mentioned those identified by color index (C. I.) names as described below:

xanthene-based metal lake color materials such as C. I. Pigment Red 81, C. I. Pigment Red 81:1, C. I. Pigment Red 81:2, C. I. Pigment Red 81:3, C. I. Pigment Red 81:4, C. I. Pigment Red 81:5, C. I. Pigment Red 82, C. I. Pigment Red 169, C. I. Pigment Violet 1, C. I. Pigment Violet 2, and C. I. Pigment Violet 2:1; and triarylmethane-based metal lake color materials such as C. I. Pigment Blue 1, C. I. Pigment Blue 1:2, C. I. Pigment Blue 2, C. I. Pigment Blue 3, C. I. Pigment Blue 8, C. I. Pigment Blue 9, C. I. Pigment Blue 10, C. I. Pigment Blue 11, C. I. Pigment Blue 12, C. I. Pigment Blue 14, C. I. Pigment Blue 53, C. I. Pigment Blue 62, C. I. Pigment Violet 3, C. I. Pigment Violet 3:1, C. I. Pigment Violet 3:3, C. I. Pigment Violet 27, C. I. Pigment Violet 39, C. I. Pigment Green 1, C. I. Pigment Green 2, C. I. Pigment Green 3, and C. I. Pigment Green 4.

Of them, a metal color material using a triarylmethane-based dye or a xanthene-based basic dye as a basic dye is suitably used from the viewpoint of achieving high luminance of the color layer.

In the present invention, from the viewpoint that, even when a metal lake color material of a xanthene-based basic dye that is easily sublimated is used, the sublimation of the color material can be inhibited, the metal lake color material of a xanthene-based basic dye is suitably used.

As the metal lake color material of a xanthene-based basic dye, for example, a color material (A-2) represented by the following general formula (VII) is preferable. By using the color material (A-2), the color layer can be adjusted to have a desired color tone and a high-luminance color filter can be obtained.

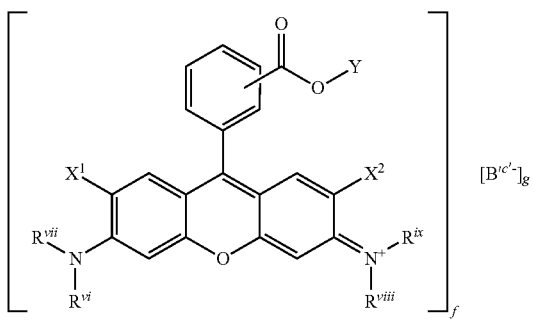

(VII)

In the general formula (VII), $B^{ic'-}$ is a "c'"-valent polyoxometalate anion; $R^{vi}$ to $R^{ix}$ are each independently a hydrogen atom, and alkyl group which can have a substituent group, an aryl group which can have a substituent group, or an aralkyl group which can have a substituent group; $X^1$ and $X^2$ are each independently a hydrogen atom, a halogen atom, or an alkyl group which can have a substituent group; Y is a hydrogen atom, an alkyl group which can have a substituent group, an aryl group which can have a substituent group, or an aralkyl group which can have a substituent group; and c' is the number of 2 or more, and f and g are the number of 1 or more.

Examples of the alkyl group as $R^{vi}$ to $R^{ix}$ include a linear or branched alkyl group having 1 to 12 carbon atoms. Of them, a linear or branched alkyl group having 1 to 8 carbon atoms is preferable, and a linear or branched alkyl group having 1 to 5 carbon atoms is more preferable, from the viewpoint of luminance and heat resistance. Of them, the alkyl group as $R^{vi}$ to $R^{ix}$ is particularly preferably an ethyl group or a methyl group. The substituent group which the alkyl group can have is not particularly limited, and examples thereof include an aryl group, a halogen atom, and a hydroxyl group. As a substituted alkyl group, for example, there may be mentioned a benzyl group.

Examples of the aryl group as $R^{vi}$ to $R^{ix}$ include an aryl group having 6 to 12 carbon atoms, and concrete examples of the aryl group include a phenyl group and a naphthyl group. Examples of the substituent group which the aryl group can have include an alkyl group and a halogen atom.

Examples of the aralkyl group as $R^{vi}$ to $R^{ix}$ include an aralkyl group having 7 to 16 carbon atoms, and concrete examples of the aralkyl group include a benzyl group, a phenethyl group, a naphthylmethyl group, and a biphenylmethyl group.

"$R^{vi}$ and $R^{vii}$ can be bound to form a ring structure, and/or $R^{viii}$ and $R^{ix}$ can be bound to form a ring structure" means that $R^{vi}$ and $R^{vii}$ form a ring structure through a nitrogen atom, and/or $R^{viii}$ and $R^{ix}$ form a ring structure through a nitrogen atom. The ring structure is not particularly limited, and examples thereof include a pyrrolidine ring, a piperidine ring and a morpholine ring.

The alkyl group as $X^1$ and $X^2$ can be the same as the alkyl group as $R^{vi}$ to $R^{ix}$. Also, examples of the halogen atom as $X^1$ and $X^2$ include a fluorine atom, a chlorine atom, and a bromine atom.

Further, the alkyl group, aryl group, and aralkyl group as Y can be the same as those as $R^{vi}$ to $R^{ix}$.

Further, in the general formula (VII), the substitution position of a —COOY group of the benzene ring attached to the xanthene skeleton is not particularly limited, but it is preferable that with respect to the xanthene skeleton, the —COOY group is in the ortho- or para-position. From the viewpoint of heat resistance and light resistance, it is preferable that the —COOY group is substituted in the ortho-position with respect to the xanthene skeleton. Although the action mechanism thereof is not clear, it is presumed that, when the —COOY group is in the ortho-position, the benzene ring resonates with the carbon atom of the xanthene skeleton to which the benzene ring is attached so that the ring structure can be formed, and thus heat resistance and light resistance are improved.

Concrete examples of the cationic skeleton in the general formula (VII) include C. I. Basic Red 1 (Rhodamine 6G), C. I. Basic Red 1:1, C. I. Basic Red 3, C. I. Basic Red 4, C. I. Basic Red 8, C. I. Basic Violet 10 (Rhodamine B), C. I. Basic Violet 11 (Rhodamine 3B), and C. I. Basic Violet 11:1 (Rhodamine A). Form the viewpoint of luminance and heat resistance, Rhodamine 6G, Rhodamine A, and Rhodamine B are preferable.

The polyoxometalate anion as described above can be appropriately used as the anion ($B^{ic'-}$) in the general formula (VII). Particularly, a polyoxometalate anion containing at least tungsten is preferable.

The molar ratio of tungsten to molybdenum in the polyoxometalate anion containing at least tungsten used in the color material (A-2) is preferably 100:0 to 85:15 from the viewpoint of heat resistance and light resistance, and particularly, from the viewpoint of heat resistance, the molar ratio is preferably 100:0 to 90:10.

As the polyoxometalate anion in the color material (A-2), the polyoxometalate anions can be used alone or in combination of two or more kinds. In the case of using a combination of two or more kinds of the above-mentioned polyoxometalate anions, the molar ratio of the tungsten to molybdenum in the whole polyoxometalate anion is preferably in the above range. Further, in order to adjust the molar ratio of the tungsten to molybdenum, a polyoxometalate anion containing no tungsten such as a phosphomolybdate ion and a silicomolybdate ion can be used in combination.

Further, in the present invention, it is preferable that the color material (A) contains a color material (A-1) represented by the following general formula (VI) and an anion in the color material (A-1) is a polyoxometalate anion containing at least tungsten, from the viewpoint that a high-luminance color filter can be obtained and heat resistance can be achieved.

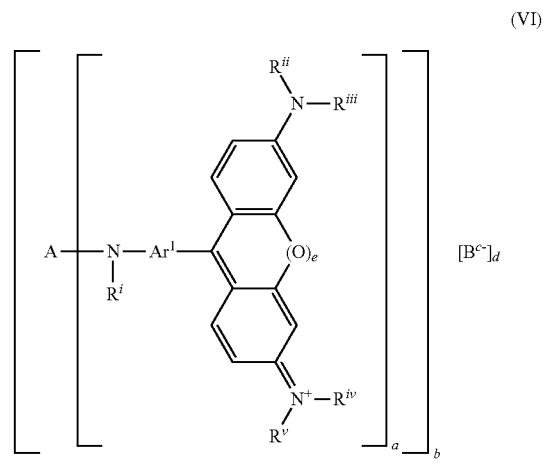

(VI)

In the general formula (VI), "A" is an "a"-valent organic group in which a carbon atom directly bound to "N" has no n bond, and the organic group is an aliphatic hydrocarbon group having a saturated aliphatic hydrocarbon group at least at a terminal position directly bound to "N", or an aromatic group having the aliphatic hydrocarbon group, and O, S, N can be contained in a carbon chain of the organic group; $B^{c-}$ is a "c"-valent polyoxometalate anion; each of $R^i$ to $R^v$ is independently a hydrogen atom, an alkyl group which can have a substituent group, or an aryl group which can have a substituent group; $R^{ii}$ and $R^{iii}$ can be bound to form a ring structure, and/or $R^{iv}$ and $R^v$ can be bound to form a ring structure; $Ar^1$ is a divalent aromatic group which can have a substituent group; a plurality of $R^i$s can be the same or different; a plurality of $R^{ii}$s can be the same or different; a plurality of $R^{iii}$s can be the same or different; a plurality of $R^{iv}$s can be the same or different; a plurality of $R^v$s can be the same or different; a plurality of $Ar^1$s can be the same or different;

"a" and "c" are each an integer of 2 or more, and "b" and "d" are each an integer of 1 or more; "e" is 0 or 1, and there is no bond when "e" is 0; and a plurality of "e"s can be the same or different.

The color material (A-1) contains divalent or higher anions and divalent or higher cations. Therefore, it is presumed that in the aggregate of the color material (A-1), each of the anions and each of the cations do not merely form an ionic bond on a one molecule-to-one molecule (one-to-one) basis, but a molecular association is formed, in which plural molecules are connected through ionic bonds and associated. For this reason, the apparent molecular weight of the color material (A-1) is significantly more than the molecular weight of conventional lake pigments. Due to the formation of such a molecular association, the cohesion in a solid state is increased higher, thus decreasing thermal motions. Therefore, it is presumed that dissociation of the ion pairs and decomposition of the cationic moieties can be inhibited, and heat resistance and light resistance are improved.

In the general formula (VI), "A" is an "a"-valent organic group in which a carbon atom directly bound to "N" (nitrogen atom) has no n bond. The organic group is an aliphatic hydrocarbon group having a saturated aliphatic hydrocarbon group at least at a terminal position directly bound to "N", or an aromatic group having the aliphatic hydrocarbon group, and O (oxygen atom), S (sulfur atom), N (nitrogen atom) can be contained in a carbon chain of the organic group. Since the carbon atom directly bound to "N" has no n bond, the color characteristics of the cationic color-forming moiety, such as color tone and transmittance, are not affected by the linking group "A" and other color-forming moieties, thereby allowing the same color as that of a single color-forming moiety.

In "A", as long as the carbon atom being at the terminal position and directly bound to "N" has no n bond, the aliphatic hydrocarbon group having a saturated aliphatic hydrocarbon group at least at a terminal position directly bound to "N", can be in a straight-chain, branched-chain or cyclic form, have an unsaturated bond in carbon atoms except the one in the terminal position, have a substituent group, or contain O, S, N in the carbon chain. For example, a carbonyl group, a carboxyl group, an oxycarbonyl group and/or an amide group can be contained, and a hydrogen atom can be substituted by a halogen atom, etc.

Also in "A", as the aromatic group having an aliphatic hydrocarbon group, there may be exemplified a monocyclic or polycyclic aromatic group which has an aliphatic hydrocarbon group having a saturated aliphatic hydrocarbon group at least at the terminal position directly bound to "N". The aromatic group can have a substituent group, and it can be a heterocyclic ring containing O, S, N.

Particularly, from the viewpoint of skeleton toughness, it is preferable that "A" contains a cyclic aliphatic hydrocarbon group or an aromatic group.

As the cyclic aliphatic hydrocarbon group, a bridged alicyclic hydrocarbon group is particularly preferable from the viewpoint of skeleton toughness. The bridged alicyclic hydrocarbon group refers to a polycyclic aliphatic hydrocarbon group having a bridged structure in the aliphatic ring and having a polycyclic structure. The examples include norbornane, bicyclo[2,2,2]octane and adamantane. Of bridged alicyclic hydrocarbon groups, norbornane is preferable. Examples of the aromatic group include groups containing a benzene ring and those containing a naphthalene ring. Of them, groups containing a benzene ring are preferable.

From the viewpoint of the availability of the raw material, "A" is preferably divalent. For example, when "A" is a divalent organic group, examples of the divalent organic group include a straight-chain, branched-chain or cyclic alkylene group having 1 to 20 carbon atoms, and an aromatic group in which two alkylene groups each having 1 to 20 carbon atoms are bound by substitution, such as a xylylene group.

The alkyl group as each of $R^i$ to $R^v$ is not particularly limited. Examples of the alkyl group include a straight- or branched-chain alkyl group having 1 to 20 carbon atoms. Of them, preferred is a straight- or branched-chain alkyl group having 1 to 8 carbon atoms, and more preferred is a straight- or branched-chain alkyl group having 1 to 5 carbon atoms, from the viewpoint of luminance and heat resistance. Of them, still more preferred is an ethyl group or a methyl group. A substituent group that the alkyl group can have is not particularly limited. The examples include an aryl group, a halogen atom and a hydroxyl group. As the substituted alkyl group, a benzyl group can be exemplified.

The aryl group as each of $R^i$ to $R^v$ is not particularly limited. The examples include a phenyl group and a naphthyl group. As a substituent group that the aryl group can have, an alkyl group and a halogen atom can be exemplified.

"$R^{ii}$ and $R^{iii}$ can be bound to form a ring structure, and/or $R^{iv}$ and $R^v$ can be bound to form a ring structure" is the same as in a case where "$R^{vi}$ and $R^{vii}$ can be bound to form a ring structure, and/or $R^{viii}$ and $R^{ix}$ can be bound to form a ring structure" described above.

Particularly, from the viewpoint of chemical stability, it is preferable that each of $R^i$ to $R^v$ is independently a hydrogen atom, an alkyl group having 1 to 5 carbon atoms, or a phenyl group. Or, it is preferable that $R^{ii}$ and $R^{iii}$ are bound to form a pyrrolidine ring, a piperidine ring or a morpholine ring, and/or $R^{iv}$ and $R^v$ are bound to form a pyrrolidine ring, a piperidine ring or a morpholine ring.

Each of $R^i$ to $R^v$ can independently have the above structure. Particularly, from the viewpoint of color purity, it is preferable that $R^i$ is a hydrogen atom. From the viewpoint of ease of production and availability of raw materials, it is more preferable that all of $R^{ii}$ to $R^v$ are the same.

The divalent aromatic group as $Ar^1$ is not particularly limited. The aromatic group as $Ar^1$ can be the same as those described above as the aromatic group as "A".

$Ar^1$ is preferably an aromatic group having 6 to 20 carbon atoms, more preferably an aromatic group having a condensed polycyclic carbon ring having 10 to 14 carbon atoms. Still more preferred are a phenylene group and a naphthylene group, from the point of view that the structure is simple and the raw materials are low-cost.

Examples of the substituent group which the aromatic group can have include an alkyl group having 1 to 5 carbon atoms and a halogen atom.

A plurality of $R^i$s per molecule can be the same or different; a plurality of $R^{ii}$s per molecule can be the same or different; a plurality of $R^{iii}$s per molecule can be the same or different; a plurality of $R^{iv}$s per molecule can be the same or different; a plurality of $R^v$s per molecule can be the same or different; and a plurality of $Ar^1$s per molecule can be the same or different. When a plurality of $R^i$s to a plurality of $R^v$s and a plurality of $Ar^1$s are each the same, color-forming moieties exhibit the same color and thus the same color as that of the single body of the color-forming moieties can be reproduced, which is favorable from the viewpoint of color purity. On the other hand, when at least one of $R^i$ to $R^v$ and $Ar^1$ is a different substituent group, color exhibited by mixing plural kinds of monomer can be reproduced and it is possible to produce a desired color.

In the color material (A-1) represented by the general formula (VI), the anionic portion ($B^{c-}$) is a "c"-valent polyoxometalate anion. By using the polyoxometalate anion, heat resistance and light resistance can be obtained.

The anion ($B^{c-}$) of the color material (A-1) is preferably a divalent or higher polyoxometalate anion containing at least tungsten, and from the viewpoint of heat resistance, a polyoxometalate anion which contains at least tungsten and can contain molybdenum, is more preferable. As the polyoxometalate anion containing at least tungsten, for example, there may be mentioned the same polyoxometalate anion as described above.

In the polyoxometalate anion containing at least tungsten, the content ratio of tungsten to molybdenum is not particularly limited, but from the viewpoint of particularly excellent heat resistance, the molar ratio of tungsten to molybdenum is preferably 100:0 to 85:15 and more preferably 100:0 to 90:10.

The polyoxometalate anions ($B^{c-}$) can be used alone or in combination of two or more kinds. In the case of using a combination of two or more kinds of the above-mentioned polyoxometalate anions, the molar ratio of the tungsten to molybdenum in the whole polyoxometalate anion is preferably in the above range.

In the general formula (VI), "b" refers to the number of cations, and "d" refers to the number of anions in the molecular association. Each of "b" and "d" is a number of 1 or more. When "b" is 2 or more, the cations in the molecular association can be of a single kind or a combination of two or more kinds. When "d" is 2 or more, the anions in the molecular association can be a single kind or a combination of two or more kinds.

In the general formula (VI), "e" is an integer of 0 or 1. "e=0" indicates a triarylmethane skeleton, and "e=1" indicates a xanthene skeleton. A plurality of "e"s can be the same or different. That is, examples include a cationic portion having a plurality of triarylmethane or xanthene skeletons only, and a cationic portion having both triarylme thane and xanthene skeletons per molecule. From the viewpoint of color purity, the anionic portion having the same skeletons only is preferable. On the other hand, by having the cationic portion including both triarylme thane and xanthene skeletons, it is possible to adjust the color of the color material represented by the general formula (VI) to a desired color.

The method for producing the color material (A-2) represented by the general formula (VII) or the color material (A-1) represented by the general formula (VI) can be appropriately selected from methods of the related arts. For example, as the method for producing the color material (A-1), the color material (A-1) can be obtained by the production method described in WO 2012/144520 A.

<Other Color Material>

In order to control color tone, the color material (A) can further contain other color material, to the extent that does not impair the effects of the present invention. As the other color material, there may be mentioned known pigments and dyes, and they are not particularly limited, as long as the effects of the present invention are not impaired, and can be the same as the case of the below-described color resin composition for a color filter.

The average dispersed particle diameter of the color material (A) used in the present invention is not particularly limited as long as a desired color can be exhibited when the color layer of a color filter is formed by the color material (A). From the viewpoint of enhancing contrast and achieving excellent heat resistance and light resistance, the average dispersed particle diameter is preferably in a range of 10 to 200 nm and more preferably in a range of 20 to 160 nm. When the average dispersed particle diameter of the color material (A) is in the above range, a liquid crystal display device and an organic light-emitting display device, which are produced by using the color resin composition for a color filter of the present invention, can be produced to have high contrast and high quality.

The average dispersed particle diameter of the color material (A) in the color material dispersion liquid is a dispersed particle diameter of the color material particles, which are dispersed in a dispersion medium containing at least a solvent, and is measured by a laser scattering particle size distribution analyzer. The measurement of the particle diameter with a laser scattering particle size distribution analyzer can be carried out as follows: the color material dispersion liquid is appropriately diluted with a solvent used in the color material dispersion liquid to have a concentration (for example, 1000-fold) at which the measurement with a laser scattering particle size distribution analyze can be carried out; and the measurement is carrier out at 23° C. by using a laser scattering particle size distribution analyzer (for example, Nanotrac Particle Size Distribution Analyzer UPA-EX150 manufactured by Nikkiso Co., Ltd.) and using a dynamic light scattering method. The average dispersed particle diameter described herein indicates a volume average particle diameter.

In the color material dispersion liquid for a color filter according to the present invention, the content of the color material is not particularly limited, but is preferably in a range of 5 to 40% by mass and more preferably in a range of 10 to 20% by mass with respect to the total amount of the color material dispersion liquid, from the viewpoint of dispersibility and dispersion stability.

Further, in the color material dispersion liquid for a color filter according to the present invention, the color material (A-1) and the metal lake color material of a xanthene-based basic dye may be mixed and used. In this case, the mixing ratio of the color material (A-1) and the metal lake color material of a xanthene-based basic dye may be appropriately set in order to adjust the color tones of the color materials to desired color tones, and there is no particular limitation on the mixing ratio. From the viewpoint of heat resistance, the mixing ratio of the color material (A-1) and the metal lake color material of a xanthene-based basic dye is preferably 50:50 to 99:1 and more preferably 70:30 to 95:5.

(C) Solvent

In the present invention, the solvent (C) can be appropriately selected from solvents which are unreactive with components in the color material dispersion liquid for a color filter according to the present invention or in the below-described color resin composition and which are able to dissolve or disperse the components. Concrete examples thereof include organic solvents such as alcohol-based solvents, ether alcohol-based solvents, ester-based solvents, ketone-based solvents, ether alcohol acetate-based solvents, ether-based solvents, aprotic amide-based solvents, lactone-based solvents, unsaturated hydrocarbon-based solvents and saturated hydrocarbon-based solvents. Of them, ester-based solvents are preferred from the viewpoint of solubility upon dispersion and coating properties.

Examples of preferred ester-based solvents include methyl methoxypropionate, ethyl ethoxypropionate, methoxy ethyl acetate, propylene glycol monomethyl ether acetate, 3-methoxy-3-methyl-1-butyl acetate, 3-methoxybutyl acetate, methoxybutyl acetate, ethoxy ethyl acetate, ethyl cellosolve acetate, dipropylene glycol methyl ether acetate, propylene glycol diacetate, 1,3-butylene glycol diacetate, cyclohexanol acetate, 1,6-hexanediol diacetate, diethylene glycol monoethyl ether acetate, and diethylene glycol monobutyl ether acetate.

Of them, propylene glycol monomethyl ether acetate (PGMEA) is preferably used, from the point of view that it has a low risk to the human body and has fast heat-drying properties although it has low volatility at around room temperature. In this case, there is such an advantage that a special washing step is not needed when switching from a conventional color resin composition using PGMEA.

These solvents can be used alone or in combination of two or more kinds.

The color material dispersion liquid for a color filter according to the present invention is prepared by using the solvent (C) generally in an amount of 50 to 95% by mass, preferably 60 to 85% by mass, with respect to the total amount of the color material dispersion liquid. When the amount of the solvent is too small, the viscosity may be increased and thus dispersibility may be easily decreased. Further, when the amount of the solvent is too large, the concentration of the color material is decreased, and thus there may be a case where it is difficult to achieve a target chromaticity coordinate after preparation of the color resin composition for a color filter.

(Other Components)

The color material dispersion liquid for a color filter according to the present invention can further contain a dispersion assisting resin and other components as needed, as long as the effects of the present invention are not impaired.

As the dispersion assisting resin, there may be mentioned an alkali soluble resin for example, which will be mentioned below under "Color resin composition for a color filter". The particles of the color material becomes less likely to contact with each other due to steric hindrance by the alkali soluble resin, resulting in stabilization of particle dispersion, and the particle dispersion stabilization effect may be effective in reducing the dispersant.

Other components include a surfactant, which is used to increase wettability, a silane coupling agent, which is used to increase adhesion properties, a defoaming agent, a cissing inhibitor, an antioxidant, an aggregation inhibitor and an ultraviolet absorber, for example.

The color material dispersion liquid for a color filter according to the present invention is used as a preliminarily prepared product for preparing the be low-described color resin composition for a color filter. That is, the color material dispersion liquid is a color material dispersion liquid which is preliminarily prepared at a stage prior to preparing the below-described color resin composition and whose "the mass of the color material component in the composition"/"the mass of the solid content other than the color material component in the composition" ratio is high. In particular, this ratio ("the mass of the color material component in the composition"/"the mass of the solid content other than the color material component in the composition" ratio) is generally 1.0 or more. By mixing the color material dispersion liquid with at least a binder component, a color resin composition with excellent dispersibility can be prepared.

Incidentally, the solid content described in the present invention means all components other than the solvent.

<Method for Producing Color Material Dispersion Liquid for a Color Filter>

In the present invention, the method for producing the color material dispersion liquid for a color filter may be a method which may contain the color material (A), the dispersant (B), the solvent (C), and various kinds of additional components used as needed, and which may homogeneously disperse the color material (A) in the solvent (C) by the dispersant (B). It is possible to homogeneously disperse the color material (A) by mixing the above-described components with a known mixing means.

Examples of the method for producing the color material dispersion liquid for a color filter include a method in which the dispersant (B) is mixed with the solvent (C), the mixture is stirred to prepare a dispersant liquid, the color material (A) and other components as needed are then mixed with the dispersant liquid, and the resultant mixture is dispersed with a known stirrer or disperser. Further, for example, the color material dispersion liquid for a color filter according to the present invention may be produced in such a manner that a color material dispersion liquid prepared by dispersing the color material (A-1) therein and a color material dispersion liquid prepared by dispersing the color material (A-2) as a metal lake color material of a xanthene-based basic dye therein are separately prepared, and these color material dispersion liquids are mixed with each other.

As the disperser used for the dispersion treatment, there may be mentioned roller mills such as a two-roller mill and a three-roller mill, ball mills such as a vibrating ball mill, paint conditioners, bead mills such as a continuous disk type bead mill and a continuous annular type bead mill, for example. In the case of using a bead mill, a preferred dispersion condition is that the diameter of the beads used is 0.03 to 2.00 mm, more preferably 0.10 to 1.0 mm.

In particular, a preparatory dispersion is carried out with 2 mm zirconia beads, which is a relatively large bead diameter, and then a main dispersion is further carried out with 0.1 mm zirconia beads, which is a relatively small bead diameter. It is preferable to carry out filtration with a 0.5 to 5.0 μm membrane filter after the dispersion treatment.

The viscosity of the color material dispersion liquid for a color filter according to the present invention is not particularly limited, but the shear viscosity at a shear rate of 60 rpm is preferably 7 mPa·s or less and more preferably 5 mPa·s or less from the viewpoint of favorable dispersibility and favorable handleability. The measurement of the shear viscosity can be carried out by using a known viscoelasticity measuring instrument and there is no particular limitation thereon. For example, measurement can be carried out by using "Rheometer MCR301" manufactured by Anton Paar.

3. Color Resin Composition for a Color Filter

The color resin composition for a color filter may be obtained by adding a binder component (D) to the color material dispersion liquid for a color filter according to the present invention. That is, it is possible to obtain a color resin composition for a color filter that includes: a color material (A), a dispersant (B), a solvent (C), and a binder component (D), in which the color material (A) contains a metal lake color material of a basic dye, and the dispersant (B) is a graft copolymer including a constitutional unit represented by the general formula (II) and at least one kind selected from the group consisting of a constitutional unit represented by the general formula (I) and a constitutional unit represented by the general formula (I'), or a block copolymer including a block portion containing a constitutional unit represented by the general formula (III) and a block portion containing at least one kind selected from the group consisting of a constitutional unit represented by the general formula (I) and a constitutional unit represented by the general formula (I'). The color resin composition for a color filter is excellent in dispersibility of a metal lake color material and able to form a high-luminance color layer having excellent heat resistance and excellent alkaline resistance.

The color resin composition contains the color material (A), the dispersant (B), the solvent (C), and the binder component (D), and may contain other components as needed.

Hereinafter, such a color resin composition for a color filter will be described. However, the color material (A), the dispersant (B), and the solvent (C) will not be described below, since they can be the same as those of the above-described color material dispersion liquid for a color filter according to the present invention.

(D) Binder Component

To provide film-forming and surface adhesion properties, the color resin composition for a color filter contains a binder component. To provide sufficient hardness to coating films, it is preferable that a curable binder component is contained in the color resin composition for a color filter. The curable binder component is not particularly limited, and conventionally-known curable binder components that are used to form color layers of color filters can be appropriately used.

As the curable binder component, for example, there may be used one containing a photocurable binder component that contains a photocurable resin, the resin being polymerizable and curable by visible light, ultraviolet or electron beam radiation, etc., or a thermosetting binder component that contains a thermosetting resin, the resin being polymerizable and curable by heating.

No developability is required of the curable binder component, when it is possible to form color layers by attaching the color resin composition for a color filter selectively in a pattern onto a substrate, such as the ink-jet method. In this case, there may be used a known thermosetting binder component or photosensitive binder component, appropriately, which are used to form color layers of color filters by the ink-jet method, etc.

As the thermosetting binder, a combination of a compound having two or more thermosetting functional groups per molecule and a curing agent is generally used. In addition, a catalyst which can promote a thermosetting reaction can be added. Examples of thermosetting functional groups include an epoxy group, an oxetanyl group, an isocyanate group and an ethylenically unsaturated bond. As the thermosetting functional groups, epoxy groups are preferably used. Concrete examples of the thermosetting binder component include those mentioned in International Publication No. WO2012/144521.

On the other hand, in the case of using a photolithography process to form color layers, a photosensitive binder component with alkali developability is suitably used.

Hereinafter, photosensitive binder components will be explained. However, the curable binder component used in the present invention is not limited to them. Besides the below-described photosensitive binder components, a thermosetting binder component that is polymerizable and curable by heating, such as epoxy resin, can be further used.

Photosensitive binder components include a positive photosensitive binder component and a negative photosensitive binder component. Examples of positive photosensitive binder components include those containing an alkali soluble resin and an o-quinonediazide group-containing compound, which is a photosensitivity-imparting component.

On the other hand, as the negative photosensitive binder component, those containing at least an alkali soluble resin, a polyfunctional monomer and a photoinitiator, are suitably used.

In the color resin composition for a color filter, the negative photosensitive binder component is preferred, from the point of view that a pattern can be easily formed by a photolithography method, using existing processes.

Hereinafter, the alkali soluble resin, the polyfunctional monomer and the photoinitiator, which constitute the negative photosensitive binder component, will be explained in detail.

(Alkali Soluble Resin)

In the present invention, the alkali soluble resin can be appropriately selected, as long as it has an acidic group, functions as a binder resin, and is soluble in developing solutions used for pattern formation, particularly preferably in an alkali developing solution.

In the present invention, the alkali soluble resin is preferably a resin having a carboxyl group as the acidic group. Concrete examples thereof include acrylic copolymers having a carboxyl group and epoxy (meth)acrylate resins having a carboxyl group. Of them, particularly preferred is one having a carboxyl group and, moreover, a photopolymerizable functional group such as an ethylenically unsaturated group in a side chain thereof. This is because the hardness of the cured film thus formed is increased by containing the photopolymerizable functional group. These acrylic copolymers and epoxy (meth)acrylate resins can be used in combination of two or more kinds.

An acrylic copolymer having a carboxyl group is obtained by copolymerizing a carboxyl group-containing ethylenically unsaturated monomer and an ethylenically unsaturated monomer.

The acrylic copolymer having a carboxyl group can further contain a constitutional unit having an aromatic carbon ring. The aromatic carbon ring functions as a component which imparts coatability to the color resin composition for a color filter.

The acrylic copolymer having a carboxyl group can further contain a constitutional unit having an ester group. The constitutional unit having an ester group not only functions as a component which inhibits alkali solubility of the color resin composition for a color filter, but also functions as a component which increases solubility in solvents and re-solubility in solvents.

Concrete examples of the acrylic copolymer having a carboxyl group include those described in International Publication No. WO2012/144521. In particular, there may be mentioned copolymers obtained from a monomer having no carboxyl group, such as methyl (meth)acrylate and ethyl (meth)acrylate, with one or more selected from (meth) acrylic acid and anhydrides thereof. Also, there may be mentioned polymers obtained by introducing an ethylenically unsaturated bond in the above copolymers by, for example, addition of an ethylenically unsaturated compound having a reactive functional group such as a glycidyl group or hydroxyl group. In the present invention, however, the acrylic copolymer having a carboxyl group is not limited to these examples.

Of these examples, the polymers obtained by introducing an ethylenically unsaturated bond in the above copolymers by, for example, addition of an ethylenically unsaturated compound having a glycidyl group or hydroxyl group, are particularly preferred from the point of view that polymerization with the below-described polyfunctional monomer is possible upon exposure, and a stable color filter can be obtained.

The copolymerization ratio of the carboxyl group-containing ethylenically unsaturated monomer in the carboxyl group-containing copolymer is generally 5 to 50% by mass, preferably 10 to 40% by mass. When the copolymerization ratio of the carboxyl group-containing ethylenically unsaturated monomer is less than 5% by mass, the solubility of the coating film thus obtained in alkali developing solutions is decreased, resulting in a difficulty with pattern formation. When the copolymerization ratio exceeds 50% by mass, upon development with an alkali developing solution, a pattern thus formed is likely to come off of the substrate, or roughening of the pattern surface is likely to occur.

The molecular weight of the carboxyl group-containing copolymer is preferably in a range of 1,000 to 500,000, more preferably in a range of 3,000 to 200,000. When the molecular weight is less than 1,000, there may be a remarkable decrease in binder function after curing. When the molecular weight exceeds 500,000, upon development with an alkali developing solution, pattern formation may be difficult.

The epoxy (meth)acrylate resin having a carboxyl group is not particularly limited. As the resin, an epoxy (meth)acrylate compound obtained by reaction of an acid anhydride with a reaction product of an epoxy compound and an unsaturated group-containing monocarboxylic acid, is suitable.

The epoxy compound, the unsaturated group-containing monocarboxylic acid and the acid anhydride can be appropriately selected from known ones. Concrete examples thereof include those described in International Publication No. WO2012/144521. As each of the epoxy compound, the unsaturated group-containing monocarboxylic acid and the acid anhydride, those mentioned above can be used alone or in combination of two or more kinds.

The alkali soluble resin used in the color resin composition for a color filter can be one kind of alkali soluble resin or a combination of two or more kinds of alkali soluble resins. The content of the alkali soluble resin is generally in a range of 10 to 1,000 parts by mass, preferably in a range of 20 to 500 parts by mass, with respect to 100 parts by mass of the color material contained in the color resin composition. When the content of the alkali soluble resin is too small, sufficient alkali developability may not be obtained. When the content is too large, the ratio of the color material is relatively small, so that sufficient color density may not be obtained.

(Polyfunctional Monomer)

The polyfunctional monomer used in the color resin composition for a color filter is not particularly limited, as long as it is polymerizable with the below-described photoinitiator. As the polyfunctional monomer, a compound having two or more ethylenically unsaturated double bonds is generally used. Preferably, the polyfunctional monomer is a polyfunctional (meth)acrylate having two or more acryloyl or methacryloyl groups.

Such a polyfunctional (meth)acrylate can be appropriately selected from conventionally known ones. Concrete examples thereof include those mentioned in International Publication No. WO2012/144521.

These polyfunctional (meth)acrylates can be used alone or in combination of two or more kinds. When excellent photocurability (high sensitivity) is required of the color resin composition in the present invention, the polyfunctional monomer is preferably one having three (trifunctional) or more polymerizable double bonds. Preferred are poly(meth) acrylates of trivalent or higher polyalcohols and dicarboxylic acid-modified products thereof. Concrete examples thereof include trimethylolpropane tri(meth)acrylate, pentaerythritol tri(meth)acrylate and succinic acid-modified products of pentaerythritol tri(meth)acrylate, pentaerythritol tetra(meth)acrylate, dipentaerythritol tetra(meth)acrylate, dipentaerythritol penta(meth)acrylate and succinic acid-modified products of dipentaerythritol penta(meth)acrylate, and dipentaerythritol hexa(meth)acrylate.

The content of the polyfunctional monomer used in the color resin composition for a color filter is not particularly limited. It is generally about 5 to 500 parts by mass, preferably in a range of 20 to 300 parts by mass, with respect to 100 parts by mass of the alkali soluble resin. When the content of the polyfunctional monomer is smaller than the range, photocuring may not proceed sufficiently and the color resin composition exposed to light may be dissolved. When the content of the polyfunctional monomer is larger than the range, there may be a decrease in alkali developability.

(Photoinitiator)

The photoinitiator used in the color resin composition for a color filter is not particularly limited. As the photoinitiator, conventionally-known various kinds of photoinitiators can be used alone or in combination of two or more kinds. Concrete examples thereof include those mentioned in International Publication No. WO2012/144521.

The content of the photoinitiator used in the color resin composition for a color filter is generally about 0.01 to 100 parts by mass, preferably 5 to 60 parts by mass, with respect to 100 parts by mass of the polyfunctional monomer. When the content is smaller than the range, sufficient polymerization reaction may not be caused, so that the hardness of the color layer may not be sufficient. When the content is larger than the range, the content of the color material and so on in the solid content of the color resin composition is relatively small, so that sufficient color density may not be obtained.

<Optionally-Added Compounds>

As needed, the color resin composition for a color filter can further contain other color material or various kinds of additives.

(Other Color Material)

Other color material can be added as needed, in order to adjust color tone. For example, it can be selected from conventionally-known pigments and dyes, according to the purpose, and such pigments and dyes can be used alone or in combination of two or more kinds.

Concrete examples of the other color material include pigments such as C. I. Pigment Violet 19, C. I. Pigment Violet 23; C. I. Pigment Blue 15, C. I. Pigment Blue 15:3, C. I. Pigment Blue 15:4, C. I. Pigment Blue 15:6, and C. I. Pigment Blue 60, and dyes such as Acid Red.

In the case of using the other color material, the content is not particularly limited, but is preferably 40 parts by mass or less and more preferably 20 parts by mass or less with respect to 100 parts by mass of the total amount of the color material (A), from the viewpoint of, for example, transmittance, heat resistance, or light resistance of the color layer.

(Antioxidant)

From the viewpoint of heat resistance and light resistance, it is preferable that the color resin composition for a color filter further contains an antioxidant. The antioxidant can be appropriately selected from conventionally-known ones. Concrete examples of the antioxidant include a hindered phenol-based antioxidant, an amine-based antioxidant, a phosphorus-based antioxidant, a sulfur-based antioxidant and a hydrazine-based antioxidant. From the viewpoint of heat resistance, it is preferable to use a hindered phenol-based antioxidant.

The hindered phenol-based antioxidant means an antioxidant that contains at least one phenol structure in which at least one of the 2- and 6-positions of the hydroxyl group is substituted with a substituent group having 4 or more carbon atoms.

In the case of using the antioxidant, the amount is not particularly limited, as long as it is in a range that does not impair the effects of the present invention. The amount of the antioxidant used is preferably 0.1 to 5.0 parts by mass, more preferably 0.5 to 4.0 parts by mass, with respect to the total solid content 100 parts by mass of the color resin composition. When the amount of the antioxidant used is equal to or more than the lower limit, excellent heat resistance is obtained. When the amount is equal to or less than the upper limit, the color resin composition can be a highly-sensitive photosensitive resin composition.

(Other Additives)

Examples of additives include, besides the above-mentioned antioxidant, a polymerization terminator, a chain transfer agent, a leveling agent, a plasticizer, a surfactant, a defoaming agent, a silane coupling agent, an ultraviolet absorber and an adhesion enhancing agent.

Concrete examples of the surfactant and the plasticizer include those mentioned in International Publication No. WO2012/144521.

<The Content of Each Component in the Color Resin Composition>

The total content of the color material (A) is preferably 3 to 65% by mass, more preferably 4 to 55% by mass, with respect to the total solid content of the color resin composition. When the total content is equal to or more than the lower limit, the color layer obtained by applying the color resin composition for a color filter to a predetermined thickness (generally 1.0 to 5.0 μm) has sufficient color density. When the total content is equal to or less than the upper limit, excellent dispersibility and dispersion stability can be obtained, and a color layer with sufficient hardness and adhesion to the substrate can be obtained. In the present invention, "solid content" includes all the above-described components other than the solvent, and it also includes the polyfunctional monomer in a liquid form.

Also, the content of the dispersant (B) is not particularly limited, as long as it is able to homogeneously disperse the color material (A). For example, the dispersant content is 3 to 40 parts by mass, with respect to the total solid content of the color resin composition. More preferably, the content is 5 to 35 parts by mass, particularly preferably 5 to 25 parts by mass, with respect to the total solid content of the color resin composition. When the content is equal to or more than the lower limit, the color material (A) has excellent dispersibility and dispersion stability, and it has excellent storage stability. When the content is equal to or less than the upper limit, excellent developing properties can be obtained.

The total amount of the binder component (D) is 10 to 92% by mass, preferably 15 to 87% by mass, with respect to the total solid content of the color resin composition. When the total amount is equal to or more than the lower limit, a color layer with sufficient hardness and adhesion to the substrate can be obtained. When the total amount is equal to or less than the upper limit, excellent developing properties can be obtained, and generation of fine wrinkles can be inhibited, which is due to heat shrinkage.

The content of the solvent (C) can be appropriately determined in a range which can form a color layer with accuracy. In general, the content is preferably in a range of 55 to 95% by mass, particularly preferably in a range of 65 to 88% by mass, with respect to the total amount of the color resin composition including the solvent. When the content of the solvent is in the range, excellent coatability can be provided to the color resin composition.

<Method for Producing the Color Resin Composition for a Color Filter>

The method for producing the color resin composition for a color filter is not particularly limited, as long as it is a method in which the color material (A), the dispersant (B), the solvent (C), the binder component (D) and various kinds of additional components that are added as needed are contained, and the color material (A) can be homogeneously dispersed in the solvent (C) by the dispersant (B). The color resin composition can be prepared by mixing them using a known mixing means.

Examples of the method for preparing the color resin composition include the following: (1) a method of mixing the color material dispersion liquid for a color filter of the present invention with the binder component (D) and various kinds of additional components used as needed; (2) a method of adding the color material (A), the dispersant (B), the binder component (D) and various kinds of additional components used as needed to the solvent (C) at the same time and mixing them; and (3) a method of adding the dispersant (B), the binder component (D) and various kinds of additional components used as needed to the solvent (C), mixing them, adding the color material (A) thereto and then mixing them.

Of these methods, the method (1) is preferred, from the viewpoint of effectively preventing the aggregation of the color material and homogeneously dispersing the color material.

4. Color Filter

The color filter according to the present invention is a color filter including at least a transparent substrate and color layers disposed on the transparent substrate, in which at least one of the color layers contains a color material (A), and a dispersant (B), the color material (A) contains a metal lake color material of a basic dye, and the dispersant (B) is a graft copolymer including a constitutional unit represented by the general formula (II) and at least one kind selected from the group consisting of a constitutional unit represented by the general formula (I) and a constitutional unit represented by the general formula (I'), or a block copolymer including a block portion containing a constitutional unit represented by the general formula (III) and a block portion containing at least one kind selected from the group consisting of a constitutional unit represented by the general formula (I) and a constitutional unit represented by the general formula (I').

Such a color filter of the present invention will be explained, with reference to figures. FIG. 1 is a schematic sectional view of an example of the color filter of the present invention. FIG. 1 shows that a color filter 10 of the present invention contains a transparent substrate 1, a light shielding part 2 and a color layer 3.

(Color Layer)

At least one of the color layers used in the color filter of the present invention contains the color material (A) and the dispersant (B). The color material (A) and the dispersant (B) will not be described below, since they are as described above.

It is generally formed on an opening of the light shielding part on the below-described transparent substrate and is generally composed of color patterns in three or more colors.

The arrangement of the color layers is not particularly limited and can be a general arrangement such as a stripe type, a mosaic type, a triangle type or a four-pixel arrangement type. The width, area, etc., of the color layer can be determined appropriately.

The thickness of the color layer is appropriately controlled by controlling the applying method, the solid content concentration, viscosity, etc., of the color resin composition for a color filter. In general, the thickness is preferably in a range of 1 to 5 μm.

The color layer used in the color filter of the present invention is preferably formed by using the color resin composition for a color filter, which contains the color material (A), the dispersant (B), the solvent (C), and the binder component (D) described above, and the color layer is preferably a cured product of the color resin composition for a color filter.

For example, when the color resin composition for a color filter is a photosensitive resin composition, the color layer can be formed by the following methods.

First, the color resin composition for a color filter is applied onto the below-described transparent substrate by a coating method such as a spray coating method, a dip coating method, a bar coating method, a roll coating method or a spin coating method to form a wet coating film.

Then, the wet coating film is dried with a hot plate, an oven, etc. The dried film is subjected to exposure through a mask with a given pattern to cause a photopolymerization reaction of the alkali soluble resin, the polyfunctional monomer, etc., thereby obtaining a photosensitive coating film. Examples of light sources and lights that can be used for the exposure include a low pressure mercury lamp, a high pressure mercury lamp and a metal halide lamp, and ultraviolet rays and electron beams. The exposure amount is appropriately controlled, according to the used light source and the thickness of the coating film.

The film can be heated to promote polymerization reaction after the exposure. The heating condition is appropriately determined, depending on the content ratio of the components used in the color resin composition of the present invention, the thickness of the coating film, etc.

Next, the thus-obtained film is developed with a developing solution to dissolve and remove unexposed portions, thereby forming a coating film in a desired pattern. As the developing solution, a solution obtained by dissolving alkali in water or aqueous solvent, is generally used. An appropriate amount of surfactant, etc., can be added to the alkali solution. The developing method can be selected from general developing methods.

After the developing treatment, generally, the developing solution is rinsed off, followed by drying of the cured coating film of the color resin composition, thereby forming a color layer. A heating treatment can be carried out after the developing treatment to sufficiently cure the coating film. The heating condition is not particularly limited and is appropriately determined depending on the intended use of the coating film.

(Light Shielding Part)

In the color filter of the present invention, the light shielding part is formed in pattern on the below-described transparent substrate, and it can be the same as those used in a general color filter.

The pattern shape of the light shielding part is not particularly limited, and examples thereof include a stripe-shaped pattern, a matrix-shaped pattern, etc. As the light shielding part, for example, there may be mentioned one produced by dispersing or dissolving a black pigment in a binder resin, and thin metal layers of chromium, chromium oxide, etc. When the light shielding part is such a thin metal layer, the layer can be a stack of two layers of one $CrO_x$ layer (x is an arbitrary number) and one Cr layer, or can be a stack of three layers of one $CrO_x$ layer (x is an arbitrary number), one $CrN_y$ layer (y is an arbitrary number) and one Cr layer, the stack of three layers having a further reduced reflectance.

When the light shielding part is one produced by dispersing or dissolving a black color material in a binder resin, the method for producing the light shielding part is not particularly limited and is only required to be a method which can pattern the light shielding part. For example, there may be mentioned a photolithography method using a color resin composition for the light shielding part, a printing method using the same, an ink-jet method using the same, etc.

When the light shielding part is a thin metal layer, the thickness is about 0.2 to 0.4 μm. When the light shielding part is formed from the black color material dispersed or dissolved in the binder resin, the thickness is about 0.5 to 2 μm.

(Transparent Substrate)

The transparent substrate of the color filter of the present invention is not particularly limited, as long as it is a substrate that is transparent to visible light. It can be selected from general transparent substrates used in color filters. Concrete examples thereof include inflexible transparent rigid materials such as silica glass plate, non-alkali glass plate and synthetic silica plate, and transparent flexible materials with flexibility and flexible properties such as transparent resin film, optical resin plate and flexible glass.

The thickness of the transparent substrate is not particularly limited. Depending on the intended use of the color filter of the present invention, one having a thickness of about 100 μm to 1 mm can be used, for example.

In addition to the transparent substrate, the light shielding part and the color layer, the color filter of the present invention can also contain an overcoat layer and a transparent electrode layer, for example. Moreover, an orientation layer and a columnar spacer can be formed in the color layer.

5. Liquid Crystal Display Device

The liquid crystal display device of the present invention includes the above-described color filter of the present invention, a counter substrate, and a liquid crystal layer disposed between the color filter and the counter substrate.

Figure 2:
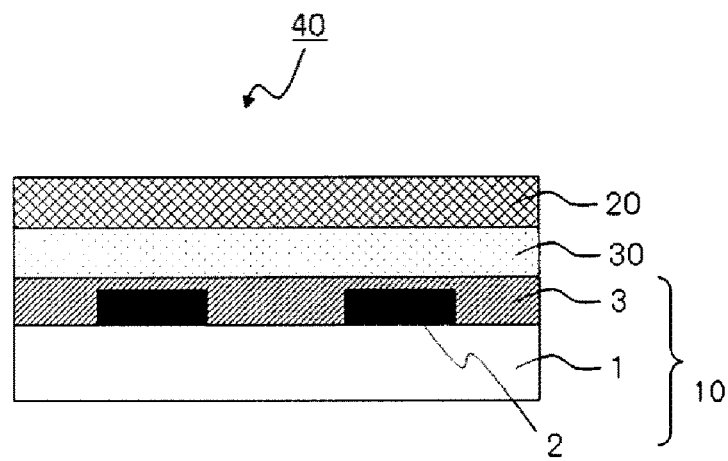
FIG. 2 is a schematic sectional view of an example of the liquid crystal display device of the present invention.

Such a liquid crystal display device of the present invention will be explained with reference to a figure. FIG. 2 is a schematic view of an example of the liquid crystal display device of the present invention. As shown in FIG. 2, a liquid crystal display device 40, which is the liquid crystal display device of the present invention, includes a color filter 10, a counter substrate 20 including a TFT array substrate, etc., and a liquid crystal layer 30 formed between the color filter 10 and the counter substrate 20.

The liquid crystal display device of the present invention is not limited to the configuration shown in FIG. 2. It can be a configuration which is generally known as a liquid crystal display device including a color filter.

The method for driving the liquid crystal display device of the present invention is not particularly limited and can be selected from driving methods which are generally used in liquid crystal display devices. Examples of such driving methods include a TN method, an IPS method, an OCB method and an MVA method. In the present invention, any of these methods can be suitably used.

The counter substrate can be appropriately selected, depending on the driving method, etc., of the liquid crystal display device of the present invention.

Also, the liquid crystal constituting the liquid crystal layer can be selected from various liquid crystals with varying dielectric anisotropies and mixtures thereof, depending on the driving method, etc., of the liquid crystal display device of the present invention.

The method for forming the liquid crystal layer can be selected from methods which are generally used to produce liquid crystal cells. Examples thereof include a vacuum injection method and a liquid crystal dripping method.

In the vacuum injection method, for example, a liquid crystal cell is produced in advance, using a color filter and a counter substrate; liquid crystal is heated to become isotropic liquid; the liquid crystal is injected into the liquid crystal cell, in the form of isotropic liquid, using the capillary effect; the liquid crystal cell is encapsulated with an adhesive agent, thereby forming a liquid crystal layer; then, the encapsulated liquid crystal can be oriented by gradually cooling the liquid crystal cell to room temperature.

In the liquid crystal dripping method, for example, a sealing agent is applied to the periphery of the color filter; the color filter is heated to the temperature at which the liquid crystal is in an isotropic phase; the liquid crystal is dripped with a dispenser or the like, in the form of isotropic liquid; the color filter and the counter substrate are stacked under reduced pressure and attached to each other via the applied sealing agent, thereby forming a liquid crystal layer; then, the encapsulated liquid crystal can be oriented by gradually cooling the liquid crystal cell to room temperature.

6. Organic Light-Emitting Display Device

The organic light-emitting display device of the present invention includes the above-described color filter of the present invention and an organic light-emitting material.

Figure 3:
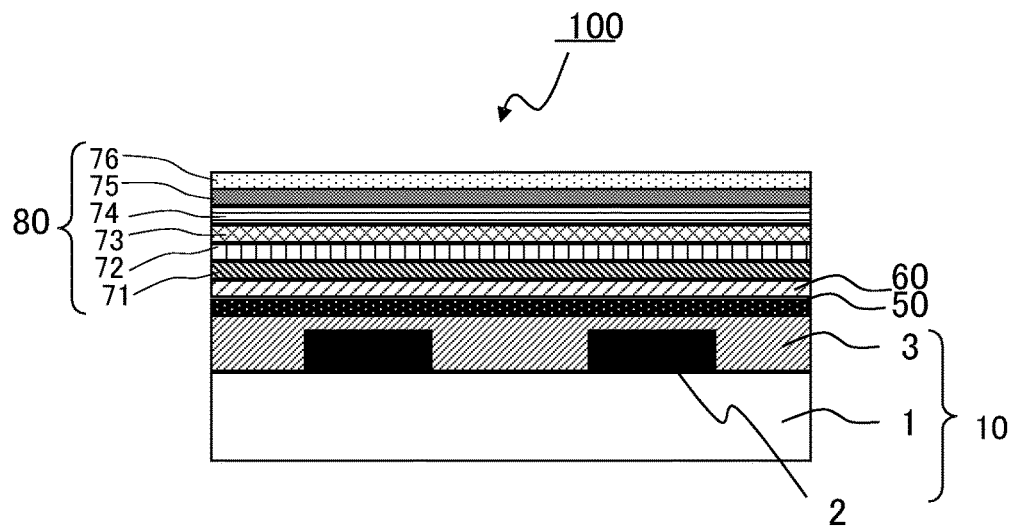
FIG. 3 is a schematic sectional view of an example of the organic light-emitting display device of the present invention.

Such an organic light-emitting display device of the present invention will be explained with reference to a figure. FIG. 3 is a schematic view of an example of the organic light-emitting display device of the present invention. As shown in FIG. 3, an organic light-emitting display device 100, which is the organic light-emitting display device of the present invention, includes a color filter 10 and an organic light-emitting material 80. An organic protection layer 50 and/or an inorganic oxide layer 60 can be disposed between the color filter 10 and the organic light-emitting material 80.

As the method for stacking the components of the organic light-emitting material 80, for example, there may be mentioned a method of stacking a transparent positive electrode 71, a positive hole injection layer 72, a positive hole transport layer 73, a light-emitting layer 74, an electron injection layer 75 and a negative electrode 76 in this sequence on the color filter, a method of attaching the organic light-emitting material 80 formed on a different substrate onto the inorganic oxide layer 60. In the organic light-emitting material 80, the transparent positive electrode 71, the positive hole injection layer 72, the positive hole transport layer 73, the light-emitting layer 74, the electron injection layer 75, the negative electrode 76 and other components can be selected from conventionally-known materials and used. The organic light-emitting display device 100 produced as above is applicable to passive or active drive organic EL displays, for example.

The organic light-emitting display device of the present invention is not limited to the configuration shown in FIG. 3. It can have any one of configurations which are generally known as those of organic light-emitting display devices including a color filter.

EXAMPLES

Hereinafter, the present invention will be described in detail by way of examples. The present invention is not limited by these examples.

Synthesis Example 1: Synthesis of Xanthene-Based Lake Color Material A

A dye solution was prepared in such a manner that 5.0 g of Rhodamine 6G (manufactured by Tokyo Chemical Industry Co., Ltd.) was added to 300 ml of water and dissolved at 90° C. An aqueous solution of phosphotungstic acid was prepared in such a manner that 11.90 g of phosphotungstic acid n-hydrate $H_3[PW_{12}O_{40}] \cdot nH_2O$ (n=30) (manufactured by NIPPON INORGANIC COLOUR & CHEMICAL CO., LTD.) was added to 100 ml of water and the mixture was stirred at 90° C. The aqueous solution of phosphotungstic acid was mixed with the foregoing dye solution at 90° C., and a precipitate thus produced was obtained by filtration and washed with water. A cake thus obtained was dried to obtain 13.45 g of a xanthene-based lake color material A corresponding to C. I. Pigment Red 81 (yield 91.9%).

Synthesis Example 2: Synthesis of Xanthene-Based Lake Color Material B

A dye solution was prepared in such a manner that 5.0 g of Rhodamine B (manufactured by Tokyo Chemical Industry Co., Ltd.) was added to 300 ml of water and dissolved at 90° C. An aqueous solution of phosphotungstic acid was prepared in such a manner that 11.90 g of phosphotungstic acid n-hydrate $H_3[PW_{12}O_{40}] \cdot nH_2O$ (n=30) was added to 100 ml of water and the mixture was stirred at 90° C. The aqueous solution of phosphotungstic acid was mixed with the foregoing dye solution at 90° C., and a precipitate thus produced was obtained by filtration and washed with water. A cake thus obtained was dried to obtain 13.79 g of a xanthene-based lake color material B corresponding to C. I. Pigment Violet 1 (yield 94.2%).

Synthesis Example 3: Synthesis of Triarylmethane-Based Lake Color Material A

With reference to the method for producing intermediates 3 and 4 described in International Publication No. WO2012/144521, 15.9 g of a dimeric triarylmethane dye represented by the following chemical formula (1) was obtained (yield 70%).

The compound thus obtained was confirmed to be a target compound from the following analysis results:

MS (ESI) (m/z): 511 (+), divalent

Elemental analysis values: CHN measurement values (78.13%, 7.48%, 7.78%); theoretical values (78.06%, 7.75%, 7.69%)

Chemical Formula (1)

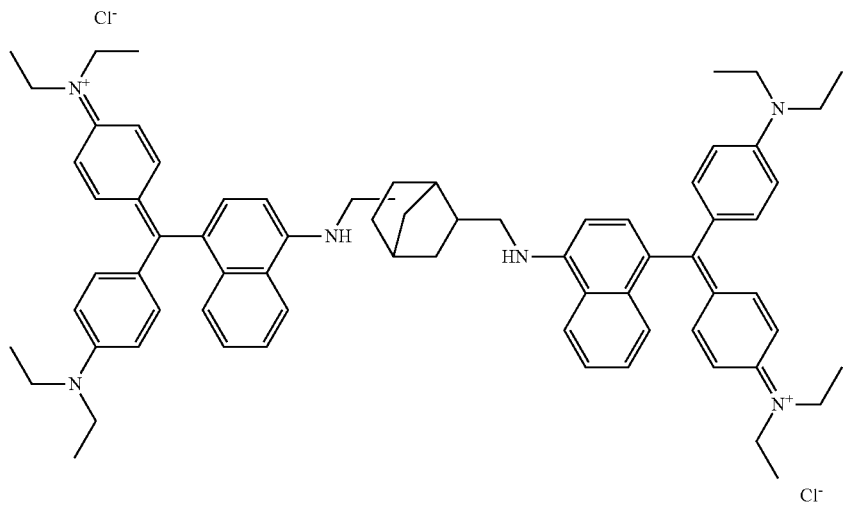

A solution of intermediate 1 was prepared in such a manner that 5.00 g of intermediate 1 was added to 300 ml of water and dissolved at 90° C. Then, an aqueous solution of phosphotungstic acid was prepared in such a manner that 10.44 g of phosphotungstic acid n-hydrate $H_3[PW_{12}O_{40}]\cdot nH_2O$ (n=30) was added to 100 ml of water and the mixture was stirred at 90° C. The aqueous solution of phosphotungstic acid was mixed with the foregoing solution of intermediate 1 at 90° C., and a precipitate thus produced was obtained by filtration and washed with water. A cake thus obtained was dried to obtain 13.25 g of a triarylmethane-based lake color material A represented by the following chemical formula (2) (yield 98%).

The compound thus obtained was confirmed to be a target compound from the following analysis results:

MS (ESI) (m/z): 510 (+), divalent

Elemental analysis values: CHN measurement values (41.55%, 5.34%, 4.32%); theoretical values (41.66%, 5.17%, 4.11%)

Synthesis Example 4: Synthesis of Macromonomer MM-1

A reactor equipped with a cooling tube, an addition funnel, a nitrogen inlet, a mechanical stirrer, and a digital thermometer was charged with 80.0 parts by mass of propylene glycol monomethyl ether acetate (PGMEA). With stirring under a nitrogen flow, the temperature of the PGMEA was increased to 90° C. A mixed solution of 50.0 parts by mass of methyl methacrylate, 30.0 parts by mass of n-butyl methacrylate, 20.0 parts by mass of benzyl methacrylate, 4.0 parts by mass of 2-mercaptoethanol, 30 parts by mass of PGMEA, and 1.0 part by mass of α,α'-azobisisobutyronitrile (AIBN) was added to the PGMEA in a dropwise manner for 1.5 hours, and the mixture was further reacted for 3 hours. Next, the nitrogen flow was stopped, and the reaction solution was cooled to 80° C. Then, 8.74 parts by mass of Karenz MOI (manufactured by Showa Denko K.K.), 0.125 part by mass of dibutyltin dilaurate, 0.125 part by mass of p-methoxyphenol, and 10 parts by mass of PGMEA Chemical Formula (2)

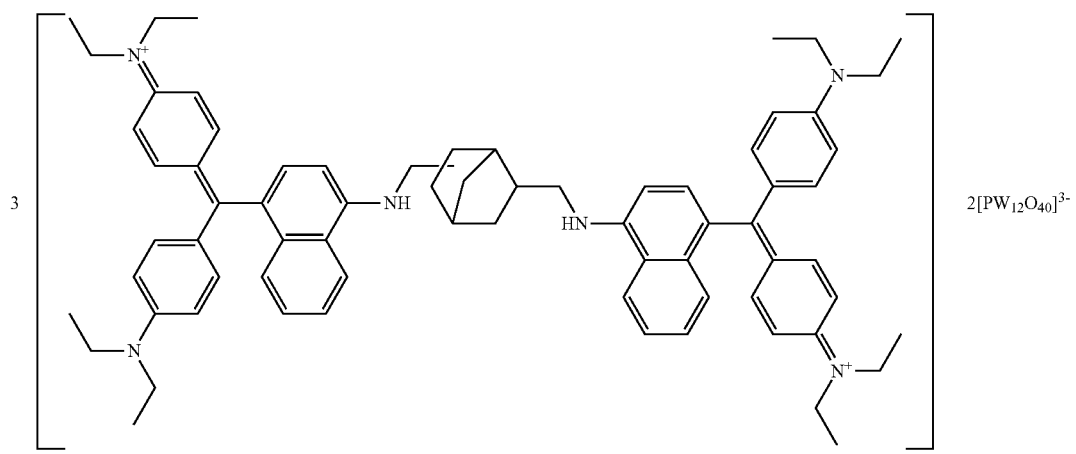

were added to the reaction solution, and the reaction solution was stirred for 3 hours, thereby obtaining a 49.5% by mass solution of the macromonomer MM-1. The macromonomer MM-1 thus obtained was confirmed by gel permeation chromatography (GPC) in a condition of N-methylpyrrolidene, addition of 0.01 mol/L lithium bromide/polystyrene standard. As a result, the macromonomer MM-1 had a mass average molecular weight (Mw) of 4,010, a number average molecular weight (Mn) of 1,910, and a molecular weight distribution (Mw/Mn) of 2.10.

Synthesis Example 5: Synthesis of Graft Copolymer A

A reactor equipped with a cooling tube, an addition funnel, a nitrogen inlet, a mechanical stirrer, and a digital thermometer was charged with 85.0 parts by mass of PGMEA. With stirring under a nitrogen flow, the temperature of the PGMEA was increased to 90° C. A mixed solution of 67.34 parts by mass (solid content 33.33 parts by mass) of the solution of the macromonomer MM-1 of Synthesis Example 4, 16.67 parts by mass of glycidyl methacrylate (GMA), 1.24 parts by mass of n-dodecyl mercaptan, 25.0 parts by mass of PGMEA, and 0.5 part by mass of AIBN was added to the PGMEA in a dropwise manner for 1.5 hours. The mixture was heated and stirred for 3 hours. A mixed solution of 0.10 part by mass of AIBN and 10.0 parts by mass of PGMEA was added thereto in a dropwise manner for 10 minutes. The mixture was further aged at the same temperature for 1 hour, thereby obtaining a 25.0% by mass solution of the graft copolymer A. As a result of GPC measurement, the thus-obtained graft copolymer A had a mass average molecular weight (Mw) of 10,570, a number average molecular weight (Mn) of 4,370, and a molecular weight distribution (Mw/Mn) of 2.42.

Production Example 1: Production of Non-Aqueous Dispersant (Phosphorus-Based Graft Copolymer A)

A reactor was charged with 100.0 parts by mass of the graft copolymer A of Synthesis Example 5, 27.80 parts by mass of PGMEA, and 9.27 parts by mass of phenylphosphonic acid (product name "PPA" manufactured by Nissan Chemical Industries, Ltd.). The mixture was stirred for 2 hours at 90° C., thereby obtaining a solution of the phosphorus-based graft copolymer A (solid content 25.0% by mass). The progress of the esterification reaction of GMA in the graft copolymer A and PPA was confirmed by an acid value measurement and $^1$H-NMR measurement (it was confirmed that the peak derived from epoxy was lost). The acid value of the thus-obtained phosphorus-based graft copolymer A was 96 mgKOH/g.

Production Example 2: Production of Non-Aqueous Dispersant (Phosphorus-Based Graft Copolymer B)

A reactor was charged with 100.0 parts by mass of the graft copolymer A of Synthesis Example 5, 19.00 parts by mass of PGMEA, and 6.33 parts by mass of vinylphosphonic acid (manufactured by Tokyo Chemical Industry Co., Ltd.). The mixture was stirred for 2 hours at 90° C., thereby obtaining a solution of the phosphorus-based graft copolymer B (solid content 25% by mass). The progress of the esterification reaction of GMA in the graft copolymer A and vinylphosphonic acid was confirmed by an acid value measurement and $^1$H-NMR measurement. The acid value of the thus-obtained phosphorus-based graft copolymer B was 104 mgKOH/g.

Comparative Production Example 1: Production of Comparative Non-Aqueous Dispersant (Phosphorus-Based Graft Copolymer C)

A reactor equipped with a cooling tube, an addition funnel, a nitrogen inlet, a mechanical stirrer, and a digital thermometer was charged with 85.0 parts by mass of PGMEA. With stirring under a nitrogen flow, the temperature of the PGMEA was increased to 90° C. A mixed solution of 90.91 parts by mass (solid content 45.0 parts by mass) of the solution of the macromonomer MM-1 of Synthesis Example 4, 5.0 parts by mass of 2-methacryloyloxyethyl acid phosphate (product name "LIGHT ESTER P-1M" manufactured by Kyoeisha Chemical Co., Ltd.), 1.24 parts by mass of n-dodecyl mercaptan, 13.0 parts by mass of PGMEA, and 0.5 part by mass of AIBN was added to the PGMEA in a dropwise manner for 1.5 hours. The mixture was heated and stirred for 3 hours. A mixed solution of 0.10 part by mass of AIBN and 10.0 parts by mass of PGMEA was added thereto in a dropwise manner for 10 minutes. The mixture was further aged at the same temperature for 1 hour, thereby obtaining a solution of the phosphorus-based graft copolymer C (solid content 25% by mass). As a result of CPC measurement, the thus-obtained phosphorus-based graft copolymer C had a mass average molecular weight (Mw) of 5,950, a number average molecular weight (Mn) of 2,930, and a molecular weight distribution (Mw/Mn) of 2.03. Incidentally, the acid value was 54 mgKOH/g.

Synthesis Example 6: Synthesis of Block Copolymer A

A reactor equipped with a cooling tube, an addition funnel, a nitrogen inlet, a mechanical stirrer, and a digital thermometer was charged with 100 parts by mass of dehydrated tetrahydrofuran and 3.00 parts by mass of dimethylketene methyl trimethylsilyl acetal, and sufficiently purged with nitrogen. Then, 0.25 part by mass of 1 M acetonitrile solution of tetrabutylammonium m-chlorobenzoate was injected with a syringe. Thereafter, a mixed solution of 50.0 parts by mass of methyl methacrylate, 30.0 parts by mass of n-butyl methacrylate, and 20.0 parts by mass of benzyl methacrylate was added thereto in a dropwise manner for 60 minutes. With cooling the reactor in an ice bath, the temperature was kept below 40° C. One hour later, 25.0 parts by mass of glycidyl methacrylate was added thereto in a dropwise manner for 20 minutes. After one hour reaction, 1 part by mass of methanol was added to terminate the reaction. Solvent displacement was carried out by evaporation with addition of 188.0 parts by mass of PGMEA to the THF solution of the block copolymer A thus obtained, thereby obtaining a 40.0% by mass PGMEA solution of the block copolymer A.

The thus-obtained block copolymer A had a mass average molecular weight (Mw) of 9,470, a number average molecular weight (Mn) of 7,880, and a molecular weight distribution (Mw/Mn) of 1.20.

Production Example 3: Production of Non-Aqueous Dispersant (Phosphorus-Based Block Copolymer A)

A reactor was charged with 100.0 parts by mass of the block copolymer A of Synthesis Example 6, 86.70 parts by mass of PGMEA, and 8.90 parts by mass of PPA. The mixture was stirred for 2 hours at 90° C., thereby obtaining a solution of the phosphorus-based block copolymer A (solid content 25% by mass). The progress of the esterification reaction of GMA in the block copolymer A and PPA was confirmed by an acid value measurement and $^1$H-NMR measurement. The acid value of the thus-obtained phosphorus-based block copolymer A was 65 mgKOH/g.

Synthesis Example 7: Synthesis of Binder Resin A

A reactor equipped with a cooling tube, an addition funnel, a nitrogen inlet, a mechanical stirrer, and a digital thermometer was charged with 130 parts by mass of diethylene glycol ethyl methyl ether (EMDG), which is a solvent. After the temperature of the solvent was increased to 90° C. under a nitrogen atmosphere, a mixture of 32 parts by mass of methyl methacrylate, 22 parts by mass of cyclohexyl methacrylate, 24 parts by mass of methacrylic acid, 2.0 parts by mass of AIBN, which is an initiator, and 4.5 parts by mass of n-dodecyl mercaptan, which is a chain transfer agent, was continuously added to the solvent in a dropwise manner for 1.5 hours.

Then, with maintaining the synthesis temperature, the reaction was continued. Two hours after the completion of the addition of the mixture in a dropwise manner, 0.05 part by mass of p-methoxyphenol, which is a polymerization inhibitor, was added thereto.

Next, with injecting air into the mixture, 22 parts by mass of glycidyl methacrylate was added to the mixture. After the temperature of the mixture was increased to 110° C., 0.2 part by mass of triethylamine was added thereto, and an addition reaction was performed at 110° C. for 15 hours in the mixture, thereby obtaining the binder resin A (solid content 44% by mass).

The binder resin A thus obtained had a mass average molecular weight (Mw) of 8,500, a number average molecular weight (Mn) of 4,200, a molecular weight distribution (Mw/Mn) of 2.02, and an acid value of 85 mgKOH/g.

Comparative Synthesis Example 1: Synthesis of Binder Resin B

A reactor equipped with a cooling tube, an addition funnel, a nitrogen inlet, a mechanical stirrer, and a digital thermometer was charged with 85.0 parts by mass of propylene glycol monomethyl ether (PGME), which is a solvent. After the temperature of the solvent was increased to 90° C. under a nitrogen atmosphere, a mixture of 90 parts by mass of methyl methacrylate, 10 parts by mass of 2-methacryloyloxyethyl acid phosphate (product name "LIGHT ESTER P-1M" manufactured by Kyoeisha Chemical Co., Ltd.), 159.0 parts by mass of PGME, and 4.6 parts by mass of AIBN, which is an initiator, was continuously added to the solvent in a dropwise manner for 1.5 hours. The mixture thus obtained was heated and stirred for 2 hours, thereby obtaining the binder resin B (solid content 30% by mass).

The binder resin B thus obtained had a mass average molecular weight (Mw) of 4,950, a number average molecular weight (Mn) of 2,240, a molecular weight distribution (Mw/Mn) of 2.21, and an acid value of 64 mgKOH/g.

Production Example 4: Production of Non-Aqueous Dispersant (Salt Type Phosphorus-Based Graft Copolymer A)

A reactor was charged with 5.59 parts by mass of PGMEA and 92.55 parts by mass (solid content 23.14 parts by mass) of the phosphorus-based graft copolymer A of Production Example 1, 1.86 parts by mass (0.5 molar equivalent with respect to the acidic group of the phosphorus-based graft copolymer A) of 1-vinyl imidazole (manufactured by Tokyo Chemical Industry Co., Ltd.) was added thereto, and the mixture was stirred for 30 minutes at 40° C., thereby preparing a solution of the salt type phosphorus-based graft copolymer A (solid content 25% by mass).

Production Example 5: Production of Non-Aqueous Dispersant (Salt Type Phosphorus-Based Graft Copolymer B)

A reactor was charged with 8.89 parts by mass of PGMEA and 88.15 parts by mass (solid content 22.04 parts by mass) of the phosphorus-based graft copolymer A of Production Example 1, 2.96 parts by mass (0.5 molar equivalent with respect to the acidic group of the phosphorus-based graft copolymer A) of 2-dimethylaminoethyl methacrylate (manufactured by Tokyo Chemical Industry Co., Ltd.) was added thereto, and the mixture was stirred for 30 minutes at 40° C., thereby preparing a solution of the salt type phosphorus-based graft copolymer B (solid content 25% by mass).

Production Example 6: Production of Non-Aqueous Dispersant (Salt Type Phosphorus-Based Graft Copolymer C)

A reactor was charged with 8.93 parts by mass of PGMEA and 88.09 parts by mass (solid content 22.02 parts by mass) of the phosphorus-based graft copolymer A of Production Example 1, 2.98 parts by mass (0.3 molar equivalent with respect to the acidic group of the phosphorus-based graft copolymer A) of 2,6-di-tert-butyl-4-dimethylaminomethyl phenol (manufactured by Tokyo Chemical Industry Co., Ltd.) was added thereto, and the mixture was stirred for 30 minutes at 40° C., thereby preparing a solution of the salt type phosphorus-based block copolymer C (solid content 25% by mass).

Production Example 7: Production of Non-Aqueous Dispersant (Salt Type Phosphorus-Based Block Copolymer A)

A reactor was charged with 3.85 parts by mass of PGMEA and 94.86 parts by mass (solid content 23.72 parts by mass) of the phosphorus-based block copolymer A of Production Example 3, 1.28 parts by mass (0.5 molar equivalent with respect to the acidic group of the phosphorus-based block copolymer A) of 1-vinylimidazole was added thereto, and the mixture was stirred for 30 minutes at 40° C., thereby preparing a solution of the salt type phosphorus-based block copolymer A (solid content 25% by mass).

Comparative Production Example 2: Production of Comparative Non-Aqueous Dispersant (Salt Type Amine-Based Block Copolymer A)

A reactor was charged with 60.74 parts by mass of PGMEA and 35.64 parts by mass (solid content 21.38 parts by mass) of a block copolymer containing a tertiary amino group (product name: BYK-LPN6919, manufactured by BYK Japan KK) (amine value: 120 mgKOH/g, solid content: 60% by mass), 3.62 parts by mass (0.5 molar equivalent with respect to the tertiary amino group of the block copolymer) of PPA was added thereto, and the mixture was stirred for 30 minutes at 40° C., thereby preparing a solution of the salt type amine-based block copolymer A (solid content 25% by mass).

Synthesis Example 8: Preparation of Binder Composition A

The binder composition A (solid content 40% by mass) was prepared by mixing 19.82 parts by mass of PGMEA, 18.18 parts by mass of the binder resin A (solid content 44% by mass) of Synthesis Example 7, 8.00 parts by mass of a pentafunctional or hexa functional acrylate monomer (product name: ARON IX M403, manufactured by TOAGOSEI CO., LTD.), 3.00 parts by mass of 2-methyl-1[4-(methylthio)phenyl]-2-morpholinopropane-1-one (product name: IRGACURE 907, manufactured by BASF), and 1.00 part by mass of 2,4-diethylthioxanthone (product name: KAYACURE DETX-S, manufactured by Nippon Kayaku Co., Ltd.).

Comparative Synthesis Example 2: Preparation of Binder Composition B

The binder composition B (solid content 40% by mass) was prepared by mixing 11.33 parts by mass of PGMEA, 26.67 parts by mass (solid content 30% by mass) of the binder resin B of Comparative Synthesis Example 1, 8.00 parts by mass of ARONIX M403, 3.00 parts by mass of IRGACURE 907, and 1.00 part by mass of KAYACURE DETX-S.

Example 1

(1) Production of Color Material Dispersion Liquid

First, 9.10 parts by mass of the triarylmethane-based lake color material A of Synthesis Example 3, 3.90 parts by mass of the xanthene-based lake color material A of Synthesis Example 1, 20.80 parts by mass (solid content 5.20 parts by mass) of the solution of the phosphorus-based graft copolymer A prepared in Production Example 1, 11.82 parts by mass (solid content 5.20 parts by mass) of the binder resin A of Synthesis Example 7, and 54.38 parts by mass of PGMEA were mixed. Using a paint shaker (manufactured by Asada Iron Works Co., Ltd.), the mixture was subjected to a pre-dispersion for 1 hour with 2 mm zirconia beads and then a main dispersion for 6 hours with 0.1 mm zirconia beads, thereby obtaining the color material dispersion liquid A.

(2) Production of Color Resin Composition

A blue color resin composition of Example 1 was obtained by adding and mixing 28.57 parts by mass of the color material dispersion liquid A obtained in above "(1) Production of color material dispersion liquid", 28.29 parts by mass of the binder composition A prepared in Synthesis Example 8, 43.14 parts by mass of PGMEA, 0.04 part by mass of surfactant R08MH (manufacture by DIG Corporation), and 0.4 part by mass of silane coupling agent KBM503 (manufactured by Shin-Etsu Chemical Co., Ltd.) and subjecting the mixture to pressure filtration.

Examples 2 to 17, and Comparative Examples 1 to 6 and 8 to 11

(1) Production of Color Material Dispersion Liquid

Color material dispersion liquids B to AA each were obtained in the same manner as in the color material dispersion liquid A in "(1) Production of color material dispersion liquid" of Example 1, except that the color material, the dispersant, and the solvent in "(1) Production of color material dispersion liquid" of Example 1 each were changed as presented in the following Table 1 and Table 2. Incidentally, the binder resin A of Synthesis Example 7 is contained in the same amount as that of the color material dispersion liquid A also in the color material dispersion liquids B to AA.

Also, in Table 1, Disperbyk-161 and Disperbyk-170 each are a urethane-based dispersant, Disperbyk-111 is a phosphoric ester-based dispersant, BYK-LPN21116 is a quaternary ammonium salt-containing acrylate-based dispersant, and all of these products are dispersants manufactured by BYK Japan KK.

In Table 1 and Table 2, the numerical value indicates part (s) by mass, and in the case of the dispersant, the numerical value indicates part (s) by mass of the dispersant liquid and part(s) by mass of the solid content in parentheses.

(2) Production of Color Resin Composition

Blue color resin compositions of Examples 2 to 17, Comparative Examples 1 to 6, and Comparative Examples 8 to 11 were obtained in the same manner as in "(2) Production of color resin composition" of Example 1, except that the color material dispersion liquids B to AA obtained as described above were used instead of the color material dispersion liquid A in "(2) Production of color resin composition" of Example 1.

Comparative Example 7

A blue color resin composition of Comparative Example 7 was obtained in the same manner as in Comparative Example 6, except that the binder composition B obtained in Comparative Synthesis Example 2 was used instead of the binder composition A in "(2) Production of color resin composition" of Comparative Example 6.

TABLE 1

| | Color material dispersion liquid | Color material | | Dispersant | Solvent | Binder composition |
|---|---|---|---|---|---|---|
| Example 1 | Color material dispersion liquid A | Triarylmethane-based lake color material A 9.1 | Xanthene-based lake color material A 3.9 | Phosphorus-based graft copolymer A 20.80 (5.2) | PGMEA 54.38 | Binder composition A |
| Example 2 | Color material dispersion liquid B | Triarylmethane-based lake color material A 9.1 | Xanthene-based lake color material A 3.9 | Salt type phosphorus-based graft copolymer A 20.80 (5.2) | PGMEA 54.38 | Binder composition A |
| Example 3 | Color material dispersion liquid C | Triarylmethane-based lake color material A 9.1 | Xanthene-based lake color material A 3.9 | Phosphorus-based graft copolymer B 20.80 (5.2) | PGMEA 54.38 | Binder composition A |

TABLE 1-continued

| | Color material dispersion liquid | Color material | | Dispersant | Solvent | Binder composition |
|---|---|---|---|---|---|---|
| Example 4 | Color material dispersion liquid D | Triarylmethane-based lake color material A 9.1 | Xanthene-based lake color material A 3.9 | Phosphorus-based block copolymer A 20.80 (5.2) | PGMEA 54.38 | Binder composition A |
| Example 5 | Color material dispersion liquid E | Triarylmethane-based lake color material A 9.1 | Xanthene-based lake color material A 3.9 | Salt type phosphorus-based block copolymer A 20.80 (5.2) | PGMEA 54.38 | Binder composition A |
| Comparative Example 1 | Color material dispersion liquid F | Triarylmethane-based lake color material A 9.1 | Xanthene-based lake color material A 3.9 | Salt type amine-based block copolymer A 20.80 (5.2) | PGMEA 54.38 | Binder composition A |
| Comparative Example 2 | Color material dispersion liquid G | Triarylmethane-based lake color material A 9.1 | Xanthene-based lake color material A 3.9 | Disperbyk-161 17.33 (5.2) | PGMEA 57.85 | Binder composition A |
| Comparative Example 3 | Color material dispersion liquid H | Triarylmethane-based lake color material A 9.1 | Xanthene-based lake color material A 3.9 | Disperbyk-170 17.33 (5.2) | PGMEA 57.85 | Binder composition A |
| Comparative Example 4 | Color material dispersion liquid I | Triarylmethane-based lake color material A 9.1 | Xanthene-based lake color material A 3.9 | Disperbyk-111 5.2 (5.2) | PGMEA 69.98 | Binder composition A |
| Comparative Example 5 | Color material dispersion liquid J | Triarylmethane-based lake color material A 9.1 | Xanthene-based lake color material A 3.9 | Phosphorus-based graft copolymer C 20.80 (5.2) | PGMEA 54.38 | Binder composition A |
| Comparative Example 6 | Color material dispersion liquid K | Triarylmethane-based lake color material A 9.1 | Xanthene-based lake color material A 3.9 | BYK-LPN21116 13.00 (5.2) | PGMEA 62.18 | Binder composition A |
| Comparative Example 7 | Color material dispersion liquid K | Triarylmethane-based lake color material A 9.1 | Xanthene-based lake color material A 3.9 | BYK-LPN21116 13.00 (5.2) | PGMEA 62.18 | Binder composition A |
| Example 6 | Color material dispersion liquid L | Triarylmethane-based lake color material A 11.96 | Xanthene-based lake color material A 1.04 | Phosphorus-based graft copolymer A 20.80 (5.2) | PGMEA 54.38 | Binder composition A |
| Example 7 | Color material dispersion liquid M | Triarylmethane-based lake color material A 11.96 | Xanthene-based lake color material A 1.04 | Salt type phosphorus-based graft copolymer A 20.80 (5.2) | PGMEA 54.38 | Binder composition A |
| Example 8 | Color material dispersion liquid N | Triarylmethane-based lake color material A 11.96 | Xanthene-based lake color material A 1.04 | Salt type phosphorus-based graft copolymer B 20.80 (5.2) | PGMEA 54.38 | Binder composition A |
| Example 9 | Color material dispersion liquid O | Triarylmethane-based lake color material A 11.96 | Xanthene-based lake color material A 1.04 | Salt type phosphorus-based graft copolymer C 20.80 (5.2) | PGMEA 54.38 | Binder composition A |
| Example 10 | Color material dispersion liquid P | Triarylmethane-based lake color material A 11.96 | Xanthene-based lake color material A 1.04 | Phosphorus-based block copolymer A 20.80 (5.2) | PGMEA 54.38 | Binder composition A |
| Comparative Example 8 | Color material dispersion liquid Q | Triarylmethane-based lake color material A 11.96 | Xanthene-based lake color material A 1.04 | Salt type amine-based block copolymer A 20.80 (5.2) | PGMEA 54.38 | Binder composition A |
| Example 11 | Color material dispersion liquid R | Triarylmethane-based lake color material A 9.1 | Xanthene-based lake color material B 3.9 | Phosphorus-based graft copolymer A 20.80 (5.2) | PGMEA 54.38 | Binder composition A |
| Comparative Example 9 | Color material dispersion liquid S | Triarylmethane-based lake color material A 9.1 | Xanthene-based lake color material B 3.9 | Salt type amine-based block copolymer A 20.80 (5.2) | PGMEA 54.38 | Binder composition A |

TABLE 2

| | Color material dispersion liquid | Color material | Dispersant | Solvent | Binder composition |
|---|---|---|---|---|---|
| Example 12 | Color material dispersion liquid T | Triarylmethane-based lake color material A 13.0 | Phosphorus-based graft copolymer A 20.80 (5.2) | PGMEA 54.38 | Binder composition A |
| Example 13 | Color material dispersion liquid U | Triarylmethane-based lake color material A 13.0 | Salt type phosphorus-based graft copolymer A 20.80 (5.2) | PGMEA 54.38 | Binder composition A |
| Example 14 | Color material dispersion liquid V | Triarylmethane-based lake color material A 13.0 | Salt type phosphorus-based graft copolymer B 20.80 (5.2) | PGMEA 54.38 | Binder composition A |

TABLE 2-continued

|  | Color material dispersion liquid | Color material | Dispersant | Solvent | Binder composition |
|---|---|---|---|---|---|
| Example 15 | Color material dispersion liquid W | Triarylmethane-based lake color material A 13.0 | Salt type phosphorus-based graft copolymer C 20.80 (5.2) | PGMEA 54.38 | Binder composition A |
| Example 16 | Color material dispersion liquid X | Triarylmethane-based lake color material A 13.0 | Phosphorus-based block copolymer A 20.80 (5.2) | PGMEA 54.38 | Binder composition A |
| Example 17 | Color material dispersion liquid Y | Triarylmethane-based lake color material A 13.0 | Salt type phosphorus-based block copolymer A 20.80 (5.2) | PGMEA 54.38 | Binder composition A |
| Comparative Example 10 | Color material dispersion liquid Z | Triarylmethane-based lake color material A 13.0 | Salt type amine-based block copolymer A 20.80 (5.2) | PGMEA 54.38 | Binder composition A |
| Comparative Example 11 | Color material dispersion liquid AA | Triarylmethane-based lake color material A 13.0 | Phosphorus-based graft copolymer C 20.80 (5.2) | PGMEA 54.38 | Binder composition A |

[Evaluation]

<Evaluation of Dispersing Performance>

To evaluate dispersing performance of each color material dispersion liquid used in Examples and Comparative Examples, the average particle diameter of color material particles in the color material dispersion liquids and the shear viscosity of the color material dispersion liquids were measured. To measure the average particle diameter, "Nanotrac Particle Size Analyzer UPA-EX150" manufactured by Nikkiso Co., Ltd. was used. For viscosity measurement, "Rheometer MCR301" manufactured by Anton Paar was used to measure the shear viscosity at a shear rate of 60 rpm. Incidentally, the average particle diameter described herein is the average dispersed particle diameter and the volume average particle diameter. The measurement results thereof are presented in Tables 3 to 5.

<Evaluation of Optical Performance and Heat Resistance>

Each of the blue color resin compositions obtained in Examples and Comparative Examples was applied onto a glass substrate having a thickness of 0.7 mm ("OA-10G" manufactured by Nippon Electric Glass Co., Ltd.) by use of a spin coater, heated and dried on a hot plate at 80° C. for 3 minutes, and then exposed to 40 mJ/cm² UV irradiation with an ultrahigh pressure mercury lamp, thereby obtaining a cured film (blue color layer). The film thickness after dried and cured was adjusted so that the film has the target chromaticity y=0.060 (Examples 1 to 5 and Comparative Examples 1 to 7) and y=0.080 (Examples 6 to 17 and Comparative Examples 8 to 11). The chromaticity (x, y), luminance (Y), and L, a, b ($L_0$, $a_0$, $b_0$) of the thus-obtained colored substrate were measured with a "microscopic spectrophotometer OSP-SP200" manufactured by Olympus Corporation. The substrate having the color layer formed thereon was post-baked in a clean oven at 230° C. for 60 minutes. Then, the chromaticity (x, y), luminance (Y), and L, a, b ($L_2$, $a_2$, $b_1$) of the thus-obtained color layer were measured again.

For evaluation of heat resistance, color difference before and after the post-baking (ΔEab) was calculated by the following equation:

$$\Delta Eab = \{(L_1-L_0)^2+(a_2-a_0)^2+(b_1-b_0)^2\}^{1/2}$$

The chromaticity (x, y) and luminance (Y) of the color layer after post-baking and color difference before and after the post-baking (ΔEab) are presented in Tables 3 to 5.

<Evaluation of Alkaline Resistance>

Each of the blue color resin compositions obtained in Examples and Comparative Examples was applied onto a glass substrate having a thickness of 0.7 mm ("OA-10G" manufactured by Nippon Electric Glass Co., Ltd.) by use of a spin coater, and then heated and dried on a hot plate at 80° C. for 3 minutes. The thus-obtained color layer was exposed to 40 mJ/cm² UV irradiation with an ultrahigh pressure mercury lamp, through a photomask with a 80 µm line-and-space stripe pattern. Then, the glass substrate having the color layer formed thereon was subjected to shower development for 60 seconds, using a 0.05% by mass potassium hydroxide aqueous solution as an alkaline developer, and washed with ultrapure water for 60 seconds, and then post-baked in a clean oven at 230° C. for 30 minutes.

The thus-obtained glass substrate having a color pattern formed thereon, was immersed in a 5.0% by mass sodium hydroxide aqueous solution kept at 40° C., and then measured for the time until the color pattern was removed from the glass substrate. The measurement results thereof are presented in Tables 3 to 5.

<Evaluation of Color Transfer>

Each of the blue color resin compositions obtained in Examples 1 to 11 and Comparative Examples 1 to 9 was applied onto a glass substrate having a thickness of 0.7 mm ("OA-10G" manufactured by Nippon Electric Glass Co., Ltd.) by use of a spin coater, and then heated and dried on a hot plate at 80° C. for 3 minutes. The thus-obtained color layer was exposed to 40 mJ/cm² UV irradiation with an ultrahigh pressure mercury lamp, through a photomask with a 80 µm line-and-space stripe pattern. Then, the glass substrate having the color layer formed thereon was subjected to shower development for 60 seconds, using a 0.05% by mass potassium hydroxide aqueous solution as an alkaline developer and washed with ultrapure water for 60 seconds.

A glass substrate was placed 0.7 mm above thus-obtained glass substrate having a color pattern formed thereon, and the glass substrate having the color layer formed thereon was heated on a hot plate at 230° C. for 30 minutes. The evaluation of the color transfer (sublimation properties) was carried out based on the following evaluation criteria by visually checking the presence of the coloration of the upper glass substrate. The evaluation results are presented in Tables 3 and 4.

[Evaluation Criteria]
A: No coloration, B: Slight coloration, C: Strong coloration

TABLE 3

| | Evaluation of dispersing performance | | Optical performance after post-baking (heat resistance evaluation) | | | | Evaluation of color transfer (sublimation properties) | Evaluation of alkaline resistance (min) |
|---|---|---|---|---|---|---|---|---|
| | Particle diameter (nm) | Viscosity (mPa·s) | x | y | Y | ΔEab | | |
| Example 1 | 143 | 4.6 | 0.158 | 0.060 | 6.23 | 3.8 | A | 36 |
| Example 2 | 150 | 3.9 | 0.157 | 0.060 | 6.23 | 4.8 | A | 35 |
| Example 3 | 157 | 4.5 | 0.157 | 0.060 | 6.25 | 3.0 | A | 38 |
| Example 4 | 150 | 4.7 | 0.158 | 0.060 | 6.23 | 3.6 | A | 36 |
| Example 5 | 160 | 4.2 | 0.157 | 0.060 | 6.23 | 4.2 | A | 34 |
| Comparative Example 1 | 132 | 5.2 | 0.160 | 0.060 | 6.11 | 11.6 | C | 34 |
| Comparative Example 2 | 171 | 4.8 | 0.158 | 0.060 | 6.17 | 8.6 | B | 28 |
| Comparative Example 3 | 192 | 5.2 | 0.158 | 0.060 | 6.16 | 8.3 | B | 28 |
| Comparative Example 4 | Gelled | | — | — | — | — | — | — |
| Comparative Example 5 | 905 | 25 | 0.158 | 0.060 | 5.99 | 5.2 | A | 9 |
| Comparative Example 6 | 132 | 4.7 | 0.163 | 0.060 | 6.02 | 13.3 | C | 37 |
| Comparative Example 7 | 132 | 4.7 | 0.162 | 0.060 | 6.07 | 12.3 | C | 7 |

TABLE 4

| | Evaluation of dispersing performance | | Optical performance after post-baking (heat resistance evaluation) | | | | Evaluation of color transfer (sublimation properties) | Evaluation of alkaline resistance (min) |
|---|---|---|---|---|---|---|---|---|
| | Particle diameter (nm) | Viscosity (mPa·s) | x | y | Y | ΔEab | | |
| Example 6 | 123 | 4.5 | 0.145 | 0.080 | 9.41 | 2.9 | A | 36 |
| Example 7 | 132 | 4.2 | 0.146 | 0.080 | 9.43 | 3.1 | A | 35 |
| Example 8 | 135 | 4.3 | 0.145 | 0.080 | 9.43 | 3.2 | A | 35 |
| Example 9 | 145 | 5.0 | 0.145 | 0.080 | 9.45 | 3.0 | A | 35 |
| Example 10 | 140 | 6.1 | 0.146 | 0.080 | 9.40 | 2.9 | A | 36 |
| Comparative Example 8 | 110 | 5.6 | 0.146 | 0.080 | 9.20 | 12.4 | B | 34 |
| Example 11 | 156 | 4.3 | 0.146 | 0.080 | 9.54 | 2.8 | A | 33 |
| Comparative Example 9 | 120 | 6.1 | 0.146 | 0.080 | 9.25 | 14.8 | C | 32 |

TABLE 5

| | Evaluation of dispersing performance | | Optical performance after post-baking (heat resistance evaluation) | | | | Evaluation of alkaline resistance (min) |
|---|---|---|---|---|---|---|---|
| | Particle diameter (nm) | Viscosity (mPa·s) | x | y | Y | ΔEab | |
| Example 12 | 110 | 4.8 | 0.140 | 0.080 | 9.20 | 3.8 | 36 |
| Example 13 | 130 | 4.3 | 0.140 | 0.080 | 9.22 | 3.9 | 37 |
| Example 14 | 132 | 4.5 | 0.140 | 0.080 | 9.21 | 4.2 | 37 |
| Example 15 | 152 | 4.7 | 0.140 | 0.080 | 9.28 | 3.6 | 37 |
| Example 16 | 138 | 5.7 | 0.140 | 0.080 | 9.18 | 4.8 | 33 |
| Example 17 | 142 | 5.3 | 0.140 | 0.080 | 9.21 | 4.2 | 33 |
| Comparative Example 10 | 104 | 5.5 | 0.140 | 0.080 | 8.71 | 12.9 | 34 |
| Comparative Example 11 | 620 | 32.2 | 0.140 | 0.080 | 8.65 | 5.3 | 8 |

[Results]

Tables 3 and 4 show the evaluation results of Examples and Comparative Examples when the triarylmethane-based lake color material A, which is a blue color material, and the xanthene-based lake color material A or B, which is a violet color material, were used as a color material. When the xanthene-based lake color material was used as a color material, in the related art, there was a problem that color transfer of the color material occurred due to high-temperature heating. However, as clearly seen from Tables 3 and 4, Examples 1 to 3, 6 to 9, and 11 using the specific graft copolymer of the dispersant (B) specified in the present invention and Examples 4, 5, and 10 using the specific block copolymer of the dispersant (B) specified in the present invention were excellent in dispersing performance and heat resistance without color transfer caused by high-temperature heating and also excellent in alkaline resistance.

On the other hand, Comparative Examples 1 to 9 using a dispersant other than the dispersant (B) specified in the present invention were inferior in at least any one of dispersing performance, heat resistance, and alkaline resistance to Examples using the same color material. Comparative Example 4, which is an example using a commercially available phosphoric ester-based dispersant, had particularly poor dispersibility of the color material and the color material was gelled. Therefore, evaluation items other than the dispersing performance cannot be evaluated. Comparative Example 5, which is an example using a polymer having a phosphonooxy group as a dispersant, had poor dispersibility of the color material and also had poor alkaline resistance. When comparing Comparative Examples 1 to 3 and 6 to 9 with Comparative Examples 4 and 5, dispersibility was favorable; however, heat resistance was poor and color transfer occurred due to high-temperature heating.

Comparative Example 7 contains a polymer having a phosphonooxy group as a binder resin; however, since the dispersant is a quaternary ammonium salt-containing acrylate-based dispersant, color transfer occurred and alkaline resistance was also poor. The reason for this is presumed that the phosphoric ester portion of the phosphonooxy group is easily hydrolyzed in the alkaline aqueous solution.

Table 5 shows the evaluation results of Examples 12 to 17 and Comparative Examples 10 and 11, which use, as a color material, only triarylmethane-based lake color material A that is a blue color material. Examples 12 to 15, which use the specific graft copolymer of the dispersant (B) specified in the present invention as a dispersant, and Examples 16 and 17, which use the specific block copolymer of the dispersant (B) specified in the present invention as a dispersant, were excellent in heat resistance as compared with Comparative Example 10 using the salt type amine-based block copolymer. Comparative Example 11, which is an example using a polymer having a phosphonooxy group as a dispersant, had poor dispersibility of the color material and also had poor alkaline resistance.

REFERENCE SIGNS LIST

1. Transparent substrate
2. Light shielding part
3. Color layer
10. Color filter
20. Counter substrate
30. Liquid crystal layer
40. Liquid crystal display device
50. Organic protection layer
60. Inorganic oxide layer
71. Transparent positive electrode
72. Positive hole injection layer
73. Positive hole transport layer
74. Light-emitting layer
75. Electron injection layer
76. Negative electrode
80. Organic light-emitting material
100. Organic light-emitting display device

The invention claimed is:

1. A non-aqueous dispersant which is a graft copolymer comprising a constitutional unit represented by the following general formula (II) and at least one kind selected from the group consisting of a constitutional unit represented by the following general formula (I) and a constitutional unit represented by the following general formula (I'), or which is a block copolymer comprising a block portion containing a constitutional unit represented by the following general formula (III) and a block portion containing at least one kind selected from the group consisting of a constitutional unit represented by the following general formula (I) and a constitutional unit represented by the following general formula (I'):

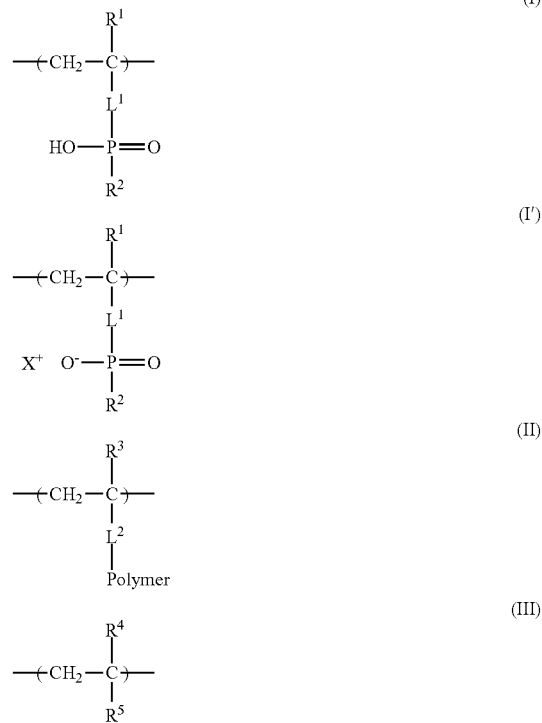

in the general formulae (I) and (I'), $L^1$ is a direct bond or a divalent linking group; $R^1$ is a hydrogen atom or a methyl group; $R^2$ is a hydrocarbon group or a monovalent group represented by —[CH($R^6$)—CH($R^7$)—O]$_{x1}$—$R^8$ or —[(CH$_2$)$_{y1}$—O]$_{z1}$—$R^8$; $R^6$ and $R^7$ are each independently a hydrogen atom or a methyl group; $R^8$ is a hydrogen atom, a hydrocarbon group or a monovalent group represented by —CHO, —CH$_2$CHO, —CO—CH=CH$_2$, —CO—C(CH$_3$)=CH, or —CH$_2$COOR$^9$; $R^9$ is a hydrogen atom or an alkyl group having 1 to 5 carbon atoms; when $R^2$ or $R^8$ is a hydrocarbon group, the hydrocarbon group of $R^2$ or $R^8$ can have a substituent group; x1 is an integer of 1 to 18; y1 is an integer of 1 to 5; and z1 is an integer of 1 to 18;

in the general formula (I'), $X^+$ is an organic cation;

in the general formula (II), $L^2$ is a direct bond or a divalent linking group; $R^3$ is a hydrogen atom or a methyl group; and "Polymer" is a polymer chain having at least one kind selected from the group consisting of a constitutional unit represented by the following general formula (IV) and a constitutional unit represented by the following general formula (V);

in the general formula (III), $R^4$ is a hydrogen atom or a methyl group; $R^5$ is a hydrocarbon group, or a monovalent group represented by —[CH($R^{10}$)—CH($R^{11}$)—O]$_{x2}$—$R^{12}$, —[(CH$_2$)$_{y2}$—O]$_{z2}$—$R^{12}$, —[CO—(CH$_2$)$_{y2}$—O]$_{z2}$—$R^{12}$, —CO—O—$R^{12'}$ or —O—CO—$R^{12''}$; $R^{10}$ and $R^{11}$ are each independently a hydrogen atom or a methyl group; $R^{12}$ is a hydrogen atom, a hydrocarbon group or a monovalent group represented by a —CHO, —CH$_2$CHO or —CH$_2$COOR$^{13}$; $R^{12'}$ is a hydrocarbon group, or a monovalent group represented by —[CH($R^{10}$)—CH($R^{11}$)—O]$_{x2'}$—$R^{12}$, —[(CH$_2$)$_{y2'}$—O]$_{z2'}$—$R^{12}$, or —[CO—(CH$_2$)$_{y2'}$—O]$_{z2'}$—$R^{12}$; $R^{12''}$ is an alkyl group having 1 to 18 carbon atoms; $R^{13}$ is a hydrogen atom or an alkyl group having 1 to 5 carbon atoms; when $R^5$, $R^{12}$, or $R^{12'}$ is a hydrocarbon group, the hydrocarbon groups of $R^5$, $R^{12}$, or $R^{12'}$ can have a substituent group each; x2 and x2' are each an integer of 1 to 18; y2 and y2' are each an integer of 1 to 5; and z2 and z2' are each an integer of 1 to 18:

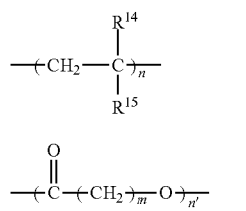

in the general formulae (IV) and (V), $R^{14}$ is a hydrogen atom or a methyl group; $R^{15}$ is a hydrocarbon group, or a monovalent group represented by —[CH($R^{16}$)—CH($R^{17}$)—O]$_{x3}$—$R^{18}$, —[(CH$_2$)$_{y3}$—O]$_{z3}$—$R^{18}$, —[CO—(CH$_2$)$_{y3}$—O]$_{z3}$—$R^{18}$, —CO—O—$R^{19}$ or —O—CO—$R^{20}$; $R^{16}$ and $R^{17}$ are each independently a hydrogen atom or a methyl group; $R^{18}$ is a hydrogen atom, a hydrocarbon group or a monovalent group represented by —CHO, —CH$_2$CHO or —CH$_2$COOR$^{21}$; $R^{19}$ is a hydrocarbon group, or a monovalent group represented by —[CH($R^{16}$)—CH($R^{17}$)—O]$_{x4}$—$R^{18}$, —[(CH$_2$)$_{y4}$—O]$_{z4}$—$R^{18}$ or —[CO—(CH$_2$)$_{y4}$—O]$_{z4}$—$R^{18}$; $R^{20}$ is an alkyl group having 1 to 18 carbon atoms; $R^{21}$ is a hydrogen atom or an alkyl group having 1 to 5 carbon atoms; when $R^{15}$, $R^{18}$, or $R^{19}$ is a hydrocarbon group, the hydrocarbon group of $R^{15}$, $R^{18}$, or $R^{19}$ can have a substituent group; m is an integer of 1 to 5; n and n' are each an integer of 5 to 200; x3 and x4 are each an integer of 1 to 18; y3 and y4 are each an integer of 1 to 5; and z3 and z4 are each an integer of 1 to 18.

2. A color material dispersion liquid for a color filter, comprising: a color material (A), a dispersant (B), and a solvent (C), wherein the color material (A) contains a metal lake color material of a basic dye, and wherein the dispersant (B) is a graft copolymer comprising a constitutional unit represented by the following general formula (II) and at least one kind selected from the group consisting of a constitutional unit represented by the following general formula (I) and a constitutional unit represented by the following general formula (I'), or a block copolymer comprising a block portion containing a constitutional unit represented by the following general formula (III) and a block portion containing at least one kind selected from the group consisting of a constitutional unit represented by the following general formula (I) and a constitutional unit represented by the following general formula (I'):

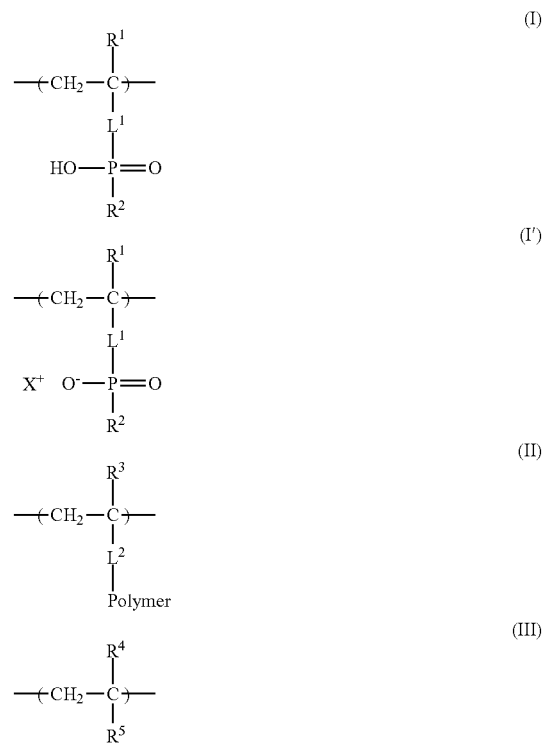

in the general formulae (I) and (I'), $L^1$ is a direct bond or a divalent linking group; $R^1$ is a hydrogen atom or a methyl group; $R^2$ is a hydrocarbon group or a monovalent group represented by —[CH($R^6$)—CH($R^7$)—O]$_{x1}$—$R^8$ or —[(CH$_2$)$_{y1}$—O]$_{z1}$—$R^8$; $R^6$ and $R^7$ are each independently a hydrogen atom or a methyl group; $R^8$ is a hydrogen atom, a hydrocarbon group or a monovalent group represented by —CHO, —CH$_2$CHO, —CO—CH=CH$_2$, —CO—C(CH$_3$)=CH, or —CH$_2$COOR$^9$; $R^9$ is a hydrogen atom or an alkyl group having 1 to 5 carbon atoms; when $R^2$ or $R^8$ is a hydrocarbon group, the hydrocarbon group of $R^2$ or $R^8$ can have a substituent group; x1 is an integer of 1 to 18; y1 is an integer of 1 to 5; and z1 is an integer of 1 to 18;

in the general formula (I'), $X^+$ is an organic cation;

in the general formula (II), $L^2$ is a direct bond or a divalent linking group; $R^3$ is a hydrogen atom or a methyl group; and "Polymer" is a polymer chain having at least one kind selected from the group consisting of a constitutional unit represented by the following general formula (IV) and a constitutional unit represented by the following general formula (V);

in the general formula (III), $R^4$ is a hydrogen atom or a methyl group; $R^5$ is a hydrocarbon group, or a monovalent group represented by —[CH($R^{10}$)—CH($R^{11}$)—O]$_{x2}$—$R^{12}$, —[(CH$_2$)$_{y2}$—O]$_{z2}$—$R^{12}$, —[CO—(CH$_2$)$_{y2}$—O]$_{z2}$—$R^{12}$, —CO—O—$R^{12'}$ or —O—CO—$R^{12''}$; $R^{10}$ and $R^{11}$ are each independently a hydrogen atom or a methyl group; $R^{12}$ is a hydrogen atom, a hydrocarbon group or a monovalent group represented by a —CHO, —CH$_2$CHO or —CH$_2$COO$R^{13}$; $R^{12'}$ is a hydrocarbon group, or a monovalent group represented by —[CH($R^{10}$)—CH($R^{11}$)—O]$_{x2'}$—$R^{12}$, —[(CH$_2$)$_2$—O]$_{z2'}$—$R^{12}$, or —[CO—(CH$_2$)$_{y2'}$—O]$_{z2'}$—$R^{12}$; $R^{12'''}$ is an alkyl group having 1 to 18 carbon atoms; $R^{13}$ is a hydrogen atom or an alkyl group having 1 to 5 carbon atoms; when $R^5$, $R^{12}$, or $R^{12'}$ is a hydrocarbon group, the hydrocarbon groups of $R^5$, $R^{12}$, or $R^{12'}$ can have a substituent group each; x2 and x2' are each an integer of 1 to 18; y2 and y2' are each an integer of 1 to 5; and z2 and z2' are each an integer of 1 to 18:

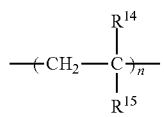

(IV)

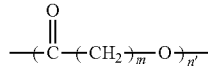

(V)

in the general formulae (IV) and (V), $R^{14}$ is a hydrogen atom or a methyl group; $R^{15}$ is a hydrocarbon group, or a monovalent group represented by —[CH($R^{16}$)—CH($R^{17}$)—O]$_{x3}$—$R^{18}$, [(CH$_2$)$_{y3}$—O]$_{z3}$—$R^{18}$, —[CO—(CH$_2$)$_{y3}$—O]$_{z3}$—$R^{18}$, —CO—O—$R^{19}$ or —O—CO—$R^{20}$; $R^{16}$ and $R^{17}$ are each independently a hydrogen atom or a methyl group; $R^{18}$ is a hydrogen atom, a hydrocarbon group or a monovalent group represented by —CHO, —CH$_2$CHO or —CH$_2$COO$R^{21}$; $R^{19}$ is a hydrocarbon group, or a monovalent group represented by —[CH($R^{16}$)—CH($R^{17}$)—O]$_{x4}$—$R^{18}$, —[(CH$_2$)$_{y4}$—O]$_{z4}$—$R^{18}$ or —[CO—(CH$_2$)$_{y4}$—O]$_{z4}$—$R^{18}$; $R^{20}$ is an alkyl group having 1 to 18 carbon atoms; $R^{21}$ is a hydrogen atom or an alkyl group having 1 to 5 carbon atoms; when $R^{15}$, $R^{18}$, or $R^{19}$ are a hydrocarbon group, the hydrocarbon group of $R^{15}$, $R^{18}$, or $R^{19}$ can have a substituent group; m is an integer of 1 to 5; n and n' are each an integer of 5 to 200; x3 and x4 are each an integer of 1 to 18; y3 and y4 are each an integer of 1 to 5; and z3 and z4 are each an integer of 1 to 18.

3. The color material dispersion liquid for a color filter according to claim 2, wherein the metal lake color material of a basic dye is a metal lake color material of a xanthene-based basic dye.

4. The color material dispersion liquid for a color filter according to claim 2, wherein the color material (A) contains a color material (A-1) represented by the following general formula (VI), and an anion in the color material (A-1) is a polyoxometalate anion containing at least tungsten:

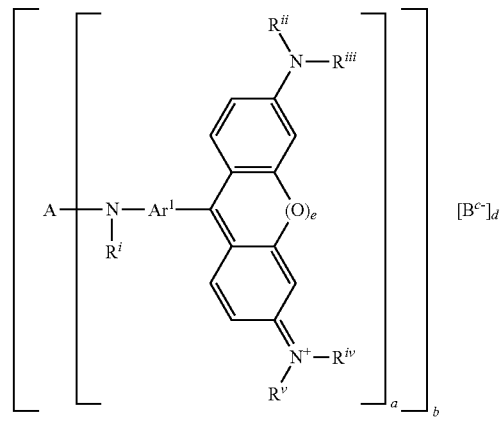

(VI)

in the general formula (VI), "A" is an "a"-valent organic group in which a carbon atom directly bound to "N" has no π bond, and the organic group is an aliphatic hydrocarbon group having a saturated aliphatic hydrocarbon group at least at a terminal position directly bound to "N", or an aromatic group having the aliphatic hydrocarbon group, and O, S, N can be contained in a carbon chain of the organic group; $B^{c-}$ is a "c"-valent polyoxometalate anion; each of $R^i$ to $R^v$ is independently a hydrogen atom, an alkyl group which can have a substituent group, or an aryl group which can have a substituent group; $R^{ii}$ and $R^{iii}$ can be bound to form a ring structure, and/or $R^{iv}$ and $R^v$ can be bound to form a ring structure; $Ar^1$ is a divalent aromatic group which can have a substituent group; a plurality of $R^i$s can be the same or different; a plurality of $R^{ii}$s can be the same or different; a plurality of $R^{iii}$s can be the same or different; a plurality of $R^{iv}$s can be the same or different; a plurality of $R^v$s can be the same or different; a plurality of $Ar^1$s can be the same or different;

"a" and "c" are each an integer of 2 or more, and "b" and "d" are each an integer of 1 or more; "e" is 0 or 1, and there is no bond when "e" is 0; and a plurality of "e"s can be the same or different.

5. A color resin composition for a color filter, comprising: a color material dispersion liquid defined by claim 2, and a binder component (D).

6. A color filter comprising at least a transparent substrate and color layers disposed on the transparent substrate,
wherein at least one of the color layers contains a color material (A), and a dispersant (B),
wherein the color material (A) contains a metal lake color material of a basic dye, and
wherein the dispersant (B) is a graft copolymer comprising a constitutional unit represented by the following general formula (II) and at least one kind selected from the group consisting of a constitutional unit represented by the following general formula (I) and a constitutional unit represented by the following general formula (I'), or a block copolymer comprising a block portion containing a constitutional unit represented by the following general formula (III) and a block portion containing at least one kind selected from the group consisting of a constitutional unit represented by the following general formula (I) and a constitutional unit represented by the following general formula (I'):

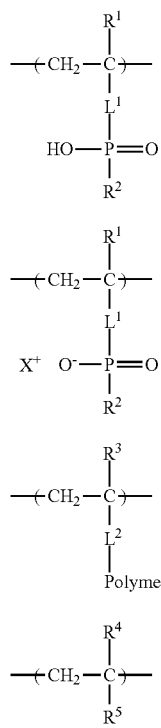

(I)

(I')

(II)

(III)

in the general formulae (I) and (I'), $L^1$ is a direct bond or a divalent linking group; $R^1$ is a hydrogen atom or a methyl group; $R^2$ is a hydrocarbon group or a monovalent group represented by $-[CH(R^6)-CH(R^7)-O]_{x1}-R^8$ or $-[(CH_2)_{y1}-O]_{z1}-R^8$; $R^6$ and $R^7$ are each independently a hydrogen atom or a methyl group; $R^8$ is a hydrogen atom, a hydrocarbon group or a monovalent group represented by $-CHO$, $-CH_2CHO$, $-CO-CH=CH_2$, $-CO-C(CH_3)=CH$, or $-CH_2COOR^9$; $R^9$ is a hydrogen atom or an alkyl group having 1 to 5 carbon atoms; when $R^2$ or $R^8$ is a hydrocarbon group, the hydrocarbon group of $R^2$ or $R^8$ can have a substituent group; x1 is an integer of 1 to 18; y1 is an integer of 1 to 5; and z1 is an integer of 1 to 18;

in the general formula (I'), $X^+$ is an organic cation;

in the general formula (II), $L^2$ is a direct bond or a divalent linking group; $R^3$ is a hydrogen atom or a methyl group; and "Polymer" is a polymer chain having at least one kind selected from the group consisting of a constitutional unit represented by the following general formula (IV) and a constitutional unit represented by the following general formula (V);

in the general formula (III), $R^4$ is a hydrogen atom or a methyl group; $R^5$ is a hydrocarbon group, or a monovalent group represented by $-[CH(R^{10})-CH(R^{11})-O]_{x2}-R^{12}$, $-[(CH_2)_{y2}-O]_{z2}-R^{12}$, $-[CO-(CH_2)_{y2}-O]_{z2}-R^{12}$, $-CO-O-R^{12}$ or $-O-CO-R^{12'}$; $R^{10}$ and $R^{11}$ are each independently a hydrogen atom or a methyl group; $R^{12}$ is a hydrogen atom, a hydrocarbon group or a monovalent group represented by a $-CHO$, $-CH_2CHO$ or $-CH_2COOR^{13}$; $R^{12'}$ is a hydrocarbon group, or a monovalent group represented by $-[CH(R^{10})-CH(R^{11})-O]_{x2'}-R^{12}$, $-[(CH_2)_{y2'}-O]_{z2'}-R^{12}$, or $-[CO-(CH_2)_{y2'}-O]_{z2'}-R^{12}$; $R^{12''}$ is an alkyl group having 1 to 18 carbon atoms; $R^{13}$ is a hydrogen atom or an alkyl group having 1 to 5 carbon atoms; when $R^5$, $R^{12}$, or $R^{12'}$ is a hydrocarbon group, the hydrocarbon groups of $R^5$, $R^{12}$, or $R^{12'}$ can have a substituent group each; x2 and x2' are each an integer of 1 to 18; y2 and y2' are each an integer of 1 to 5; and z2 and z2' are each an integer of 1 to 18:

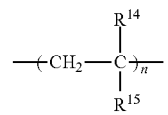

(IV)

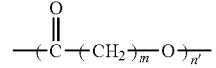

(V)

in the general formulae (IV) and (V), $R^{14}$ is a hydrogen atom or a methyl group; $R^{15}$ is a hydrocarbon group, or a monovalent group represented by $-[CH(R^{16})-CH(R^{17})-O]_{x3}-R^{18}-[(CH_2)_{y3}-O]_{z3}-R^{18}$, $-[CO-(CH_2)_{y3}-O]_{z3}-R^{18}$, $-CO-O-R^{19}$ or $-O-CO-R^{20}$; $R^{16}$ and $R^{17}$ are each independently a hydrogen atom or a methyl group; $R^{18}$ is a hydrogen atom, a hydrocarbon group or a monovalent group represented by $-CHO$, $-CH_2CHO$ or $-CH_2COOR^{21}$; $R^{19}$ is a hydrocarbon group, or a monovalent group represented by $-[CH(R^{16})-CH(R^{17})-O]_{x4}-R^8$, $-[(CH_2)_{y4}-O]_{z4}-R^{18}$ or $-[CO-(CH_2)_{y4}-O]_{z4}-R^{18}$; $R^{20}$ is an alkyl group having 1 to 18 carbon atoms; $R^{21}$ is a hydrogen atom or an alkyl group having 1 to 5 carbon atoms; when $R^{15}$, $R^{18}$, or $R^{19}$ are a hydrocarbon group, the hydrocarbon group of $R^{15}$, $R^{18}$, or $R^{19}$ can have a substituent group; m is an integer of 1 to 5; n and n' are each an integer of 5 to 200; x3 and x4 are each an integer of 1 to 18; y3 and y4 are each an integer of 1 to 5; and z3 and z4 are each an integer of 1 to 18.

7. A liquid crystal display device comprising the color filter defined by claim 6, a counter substrate, and a liquid crystal layer disposed between the color filter and the counter substrate.

8. An organic light-emitting display device comprising the color filter defined by claim 6 and an organic light-emitting material.

9. A method for producing the non-aqueous dispersant defined by claim 1, the method comprising any one of the following steps (i) or (ii):

(i) reacting an organic phosphonic acid compound with a reactive group of a graft copolymer including a constitutional unit represented by the general formula (II) and a constitutional unit derived from a monomer having the reactive group and an ethylenically unsaturated double bond, the reactive group being selected from the group consisting a glycidyl group, an alicyclic epoxy group, an oxetane group, and a hydroxyl group;

(ii) reacting an organic phosphonic acid compound with a reactive group of a block copolymer including a constitutional unit represented by the general formula (III) and a constitutional unit derived from a monomer having the reactive group and an ethylenically unsaturated double bond, the reactive group being selected from the group consisting a glycidyl group, an alicyclic epoxy group, an oxetane group, and a hydroxyl group:

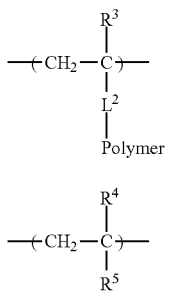

(II)

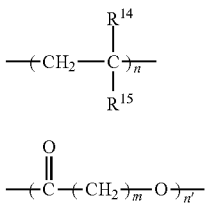

(III)

in the general formula (II), $L^2$ is a direct bond or a divalent linking group; $R^3$ is a hydrogen atom or a methyl group; and "Polymer" is a polymer chain having at least one kind selected from the group consisting of a constitutional unit represented by the following general formula (IV) and a constitutional unit represented by the following general formula (V);

in the general formula (III), $R^4$ is a hydrogen atom or a methyl group; $R^5$ is a hydrocarbon group, or a monovalent group represented by —[CH($R^{10}$)—CH($R^{11}$)—O]$_{x2}$—$R^{12}$, —[(CH$_2$)$_{y2}$—O]$_{z2}$—$R^{12}$, —[CO—(CH$_2$)$_{y2}$—O]$_{z2}$—$R^{12}$, —CO—O—$R^{12'}$ or —O—CO—$R^{12'}$; $R^{10}$ and $R^{11}$ are each independently a hydrogen atom or a methyl group; $R^{12}$ is a hydrogen atom, a hydrocarbon group or a monovalent group represented by a —CHO, —CH$_2$CHO or —CH$_2$COOR$^{13}$; $R^{12'}$ is a hydrocarbon group, or a monovalent group represented by —[CH($R^{10}$)—CH($R^{11}$)—O]$_{x2'}$—$R^{12}$, —[(CH$_2$)$_2$—O]$_{z2'}$—$R^{12}$, or —[CO—(CH$_2$)$_{y2'}$—O]$_{z2'}$—$R^{12}$; $R^{12''}$ is an alkyl group having 1 to 18 carbon atoms; $R^{13}$ is a hydrogen atom or an alkyl group having 1 to 5 carbon atoms; when $R^5$, $R^{12}$, or $R^{12'}$ is a hydrocarbon group, the hydrocarbon groups of $R^5$, $R^{12}$, Or $R^{12'}$ can have a substituent group each; x2 and x2' are each an integer of 1 to 18; y2 and y2' are each an integer of 1 to 5; and z2 and z2' are each an integer of 1 to 18:

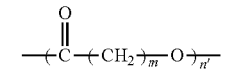

(IV)

(V)

in the general formulae (IV) and (V), $R^{14}$ is a hydrogen atom or a methyl group; $R^{15}$ is a hydrocarbon group, or a monovalent group represented by —[CH($R^{16}$)—CH($R^{17}$)—O]$_{x3}$—$R^{18}$, —[(CH$_2$)$_{y3}$—O]$_{z3}$—$R^{18}$, —[CO—(CH$_2$)$_{y3}$—O]$_{z3}$—$R^{18}$, —CO—O—$R^{19}$ or —O—CO—$R^{20}$; $R^{16}$ and $R^{17}$ are each independently a hydrogen atom or a methyl group; $R^{18}$ is a hydrogen atom, a hydrocarbon group or a monovalent group represented by —CHO, —CH$_2$CHO or —CH$_2$COOR$^{21}$; $R^{19}$ is a hydrocarbon group, or a monovalent group represented by —[CH($R^{16}$)—CH($R^{17}$)—O]$_{x4}$—$R^{18}$, —[(CH$_2$)$_{y4}$—O]$_{z4}$—$R^{18}$ or —[CO—(CH$_2$)$_{y4}$—O]$_{z4}$—$R^{18}$; $R^{20}$ is an alkyl group having 1 to 18 carbon atoms; $R^{21}$ is a hydrogen atom or an alkyl group having 1 to 5 carbon atoms; when $R^{15}$, $R^{18}$, or $R^{19}$ is a hydrocarbon group, the hydrocarbon group of $R^{15}$, $R^{18}$, or $R^{19}$ can have a substituent group; m is an integer of 1 to 5; n and n' are each an integer of 5 to 200; x3 and x4 are each an integer of 1 to 18; y3 and y4 are each an integer of 1 to 5; and z3 and z4 are each an integer of 1 to 18.

* * * * *